(12) United States Patent
Min et al.

(10) Patent No.: US 10,186,579 B2
(45) Date of Patent: Jan. 22, 2019

(54) SEMICONDUCTOR DEVICES

(71) Applicant: Samsung Electronics Co., Ltd., Suwon-si, Gyeonggi-do (KR)

(72) Inventors: Kyungseok Min, Yongin-si (KR); Sung Dae Suk, Seoul (KR); JeongYun Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/862,308

(22) Filed: Jan. 4, 2018

(65) Prior Publication Data

US 2018/0190772 A1    Jul. 5, 2018

(30) Foreign Application Priority Data

Jan. 5, 2017  (KR) .......................... 10-2017-0001938

(51) Int. Cl.
| | | |
|---|---|---|
| *H01L 23/52* | (2006.01) | |
| *H01L 29/10* | (2006.01) | |
| *H01L 29/78* | (2006.01) | |
| *H01L 29/417* | (2006.01) | |
| *H01L 29/06* | (2006.01) | |

(52) U.S. Cl.
CPC ...... *H01L 29/1033* (2013.01); *H01L 29/0649* (2013.01); *H01L 29/41775* (2013.01); *H01L 29/7833* (2013.01)

(58) Field of Classification Search
CPC ............ H01L 29/1033; H01L 29/0649; H01L 29/7833; H01L 29/41775
See application file for complete search history.

(56) References Cited

U.S. PATENT DOCUMENTS

| | | |
|---|---|---|
| 7,345,338 B1 | 3/2008 | Han et al. |
| 8,071,481 B2 | 12/2011 | Kao et al. |
| 9,034,706 B2 | 5/2015 | Liu et al. |
| 9,142,643 B2 | 9/2015 | Cheng et al. |
| 9,293,581 B2 | 3/2016 | Yu et al. |
| 9,373,718 B2 | 6/2016 | Li et al. |
| 9,443,852 B2 | 9/2016 | Jeong et al. |
| 2015/0311340 A1 | 10/2015 | Ma et al. |
| 2016/0087104 A1 | 3/2016 | Lee et al. |
| 2017/0133263 A1 | 5/2017 | Min et al. |

FOREIGN PATENT DOCUMENTS

| | | |
|---|---|---|
| KR | 10-2013-0107183 A | 10/2013 |
| KR | 10-2017-0054635 A | 5/2017 |

*Primary Examiner* — Elias M Ullah
(74) *Attorney, Agent, or Firm* — Harness, Dickey & Pierce, P.L.C

(57) ABSTRACT

A semiconductor device includes a device isolation layer on a substrate, a first active pattern defined by the device isolation layer, and source/drain regions. The first active pattern extends in a first direction and includes a channel region between a pair of recesses formed at an upper portion of the first active pattern. The source/drain regions fill the pair of recesses in the first active pattern. Each of the source/drain regions include a first semiconductor pattern in the recess and a second semiconductor pattern on the first semiconductor pattern. The source/drain region have an upper portion whose width is less than a width of its lower portion. The second semiconductor pattern has an upper portion whose width is less than a width of its lower portion. The upper portion of the second semiconductor pattern is positioned higher than a top surface of the channel region.

20 Claims, 44 Drawing Sheets

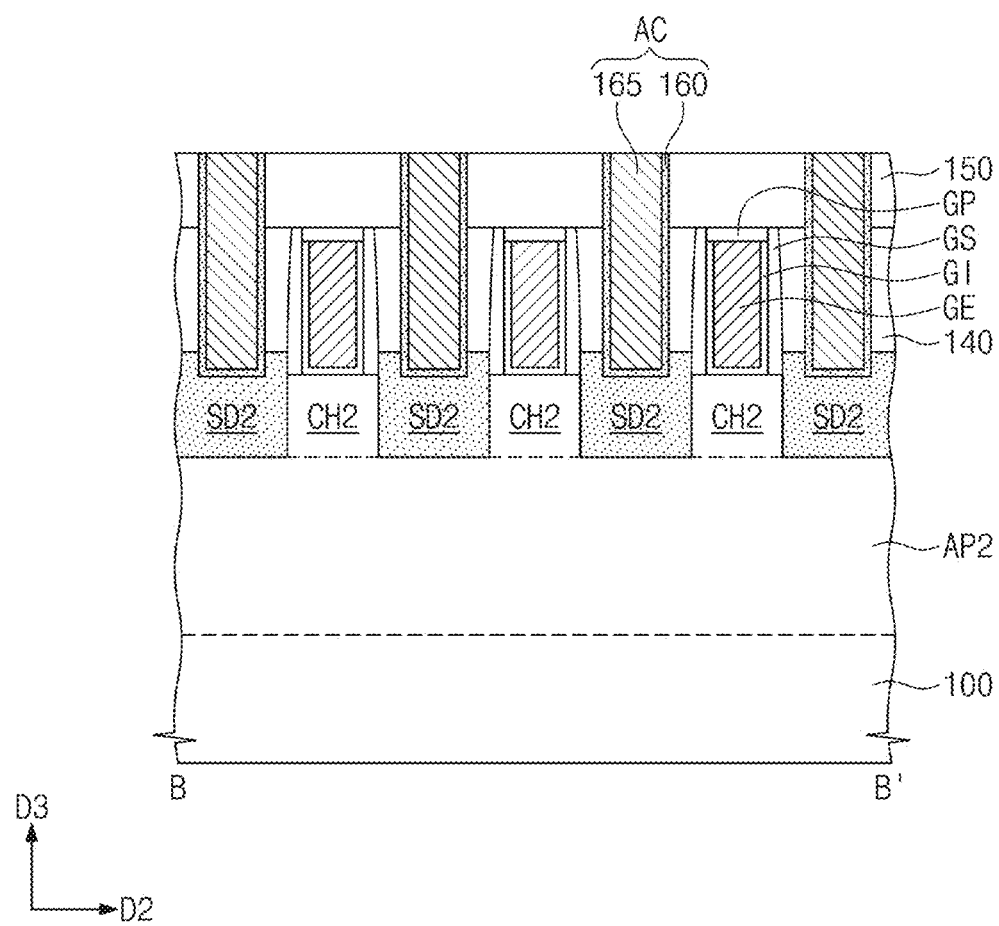

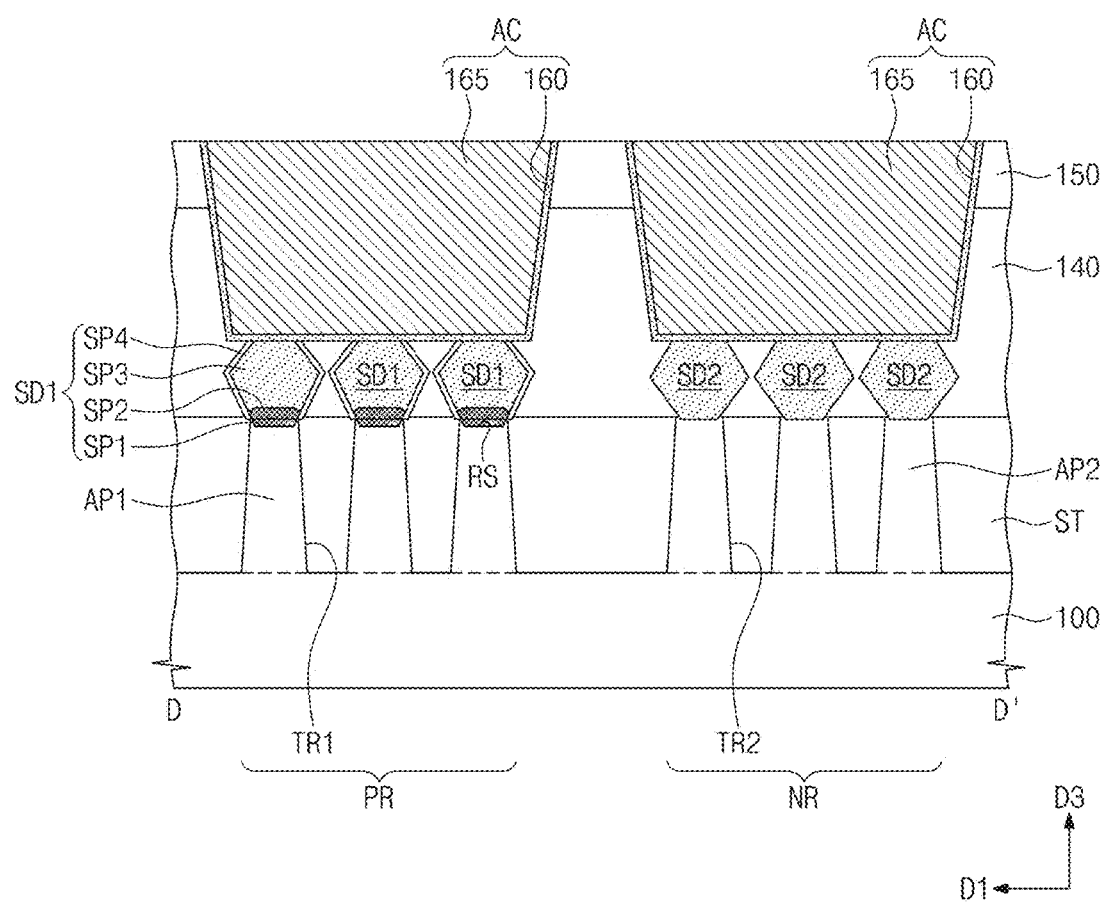

SEMICONDUCTOR DEVICES

CROSS-REFERENCE TO RELATED APPLICATIONS

This U.S. nonprovisional patent application claims priority under 35 U.S.C § 119 to Korean Patent Application No. 10-2017-0001938, filed on Jan. 5, 2017 in the Korean Intellectual Property Office, the entire contents of which are hereby incorporated by reference.

BACKGROUND

Inventive concepts relate to a semiconductor device, and more particularly, to a semiconductor device including a fin field effect transistor.

Semiconductor devices are used in electronic industry because of their small size, multi-function, and/or low fabrication cost. The semiconductor devices may be categorized as any one of semiconductor memory devices for storing logic data, semiconductor logic devices for processing operations of logic data, and hybrid semiconductor devices having both memory and logic elements. The semiconductor devices have been increasingly used in the electronic industry. For example, the semiconductor devices have been increasingly used for high reliability, high speed, and/or multifunction applications. The semiconductor devices are gradually complicated and highly integrated to meet requested characteristics.

SUMMARY

Inventive concepts relate to a semiconductor device including a field effect transistor that has enhanced electrical characteristics.

According to some example embodiments of inventive concepts, a semiconductor device may include: a substrate including a first region and a second region; and a device isolation layer on the substrate, the device isolation layer defining a first active pattern, the first active pattern extending in a first direction on the first region, the first active pattern including a channel region between a pair of recesses formed at an upper portion of the first active pattern; and a pair of source/drain regions filling the pair of recesses in the first active pattern. Each of the pair of source/drain regions may include a first semiconductor pattern on an inner sidewall of the recesses and a second semiconductor pattern on the first semiconductor pattern. A width of the pair of the source/drain regions in the first direction at an upper portion of the pair of source/drain regions may be less than the width of the pair of source/drain regions in the first direction at a lower portion of the pair of source/drain regions. A width of the second semiconductor pattern in the first direction may be less at an upper portion of the second pattern than the width of the second semiconductor pattern in the first direction at a lower portion of the second semiconductor pattern. The upper portion of the second semiconductor pattern may be positioned higher than a top surface of the channel region.

According to some example embodiments of inventive concepts, a semiconductor device may include a substrate including a first region and a second region, and a first active pattern on the first region of the substrate. The first active pattern may extend in a first direction. The first active pattern may include a channel region and a pair of source/drain regions spaced apart from each other in the first direction across the channel region. The substrate may contain a first semiconductor element. The pair of source/drain regions may contain a second semiconductor element whose lattice constant is greater than a lattice constant of the first semiconductor element. The pair of source/drain regions may include a plurality of semiconductor patterns sequentially stacked. The plurality of semiconductor patterns may include a first semiconductor pattern. A content of the second semiconductor element in the first semiconductor pattern may be greater content than a content of the second semiconductor element in any other one of the plurality of semiconductor patterns. A width of the first semiconductor pattern at an upper portion of the first semiconductor pattern may be less than the width of the first semiconductor pattern in the first direction at a lower portion of the first semiconductor pattern. The upper portion of the first semiconductor pattern may be positioned higher than a top surface of the channel region.

According to some example embodiments of inventive concepts, a semiconductor device may include a substrate, a plurality of active patterns spaced apart from each other on the substrate, a gate dielectric pattern, and source/drain regions. The plurality of active patterns may include a first active pattern extending a first direction. The first active pattern may include first channel regions and recessed regions alternately arranged in the first direction. The first channel regions may protrude above the recessed regions. The recessed regions of the first active pattern may have a maximum width at a level between a top surface of the first channel regions and a bottom surface of the recessed regions. The gate electrode may cross over the first channel regions of the first active pattern. The gate dielectric pattern may be between the gate electrode and the first channel regions of the first active pattern. The source/drain regions may be in the recessed regions of the first active pattern.

BRIEF DESCRIPTION OF THE DRAWINGS

FIGS. 2A, 2B, 2C, and 2D are cross-sectional views respectively taken along lines A-A', B-B', C-C', and D-D' of FIG. 1.

DETAILED DESCRIPTION

Figure 1:
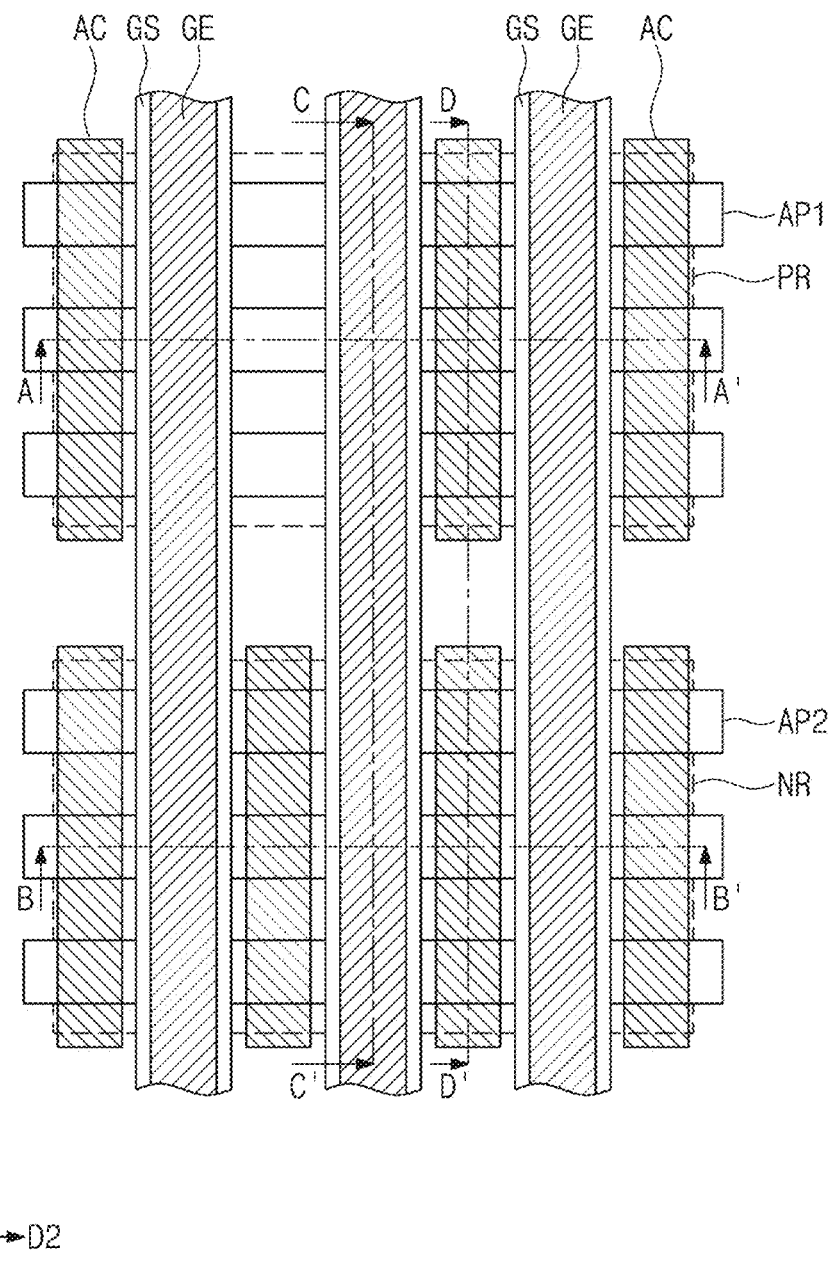
FIG. 1 is a plan view for explaining a semiconductor device according to some example embodiments of inventive concepts.
Figure 2A:
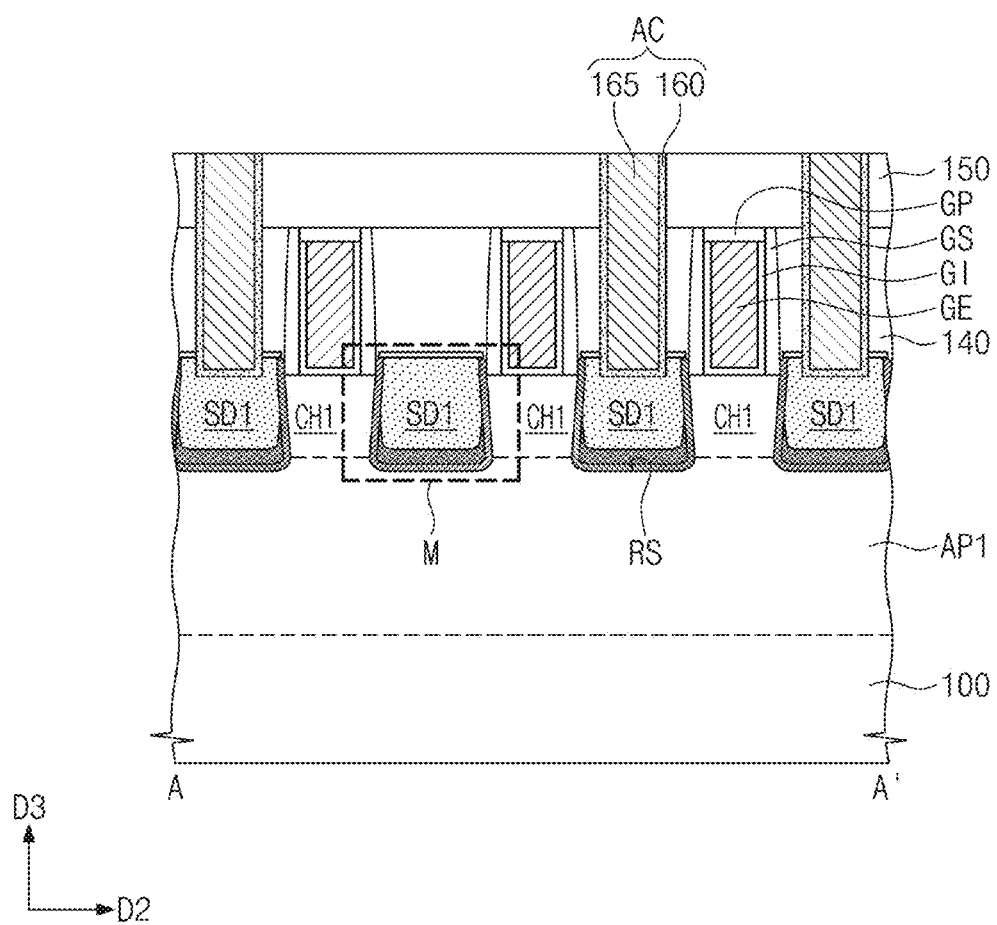
Figure 2C:
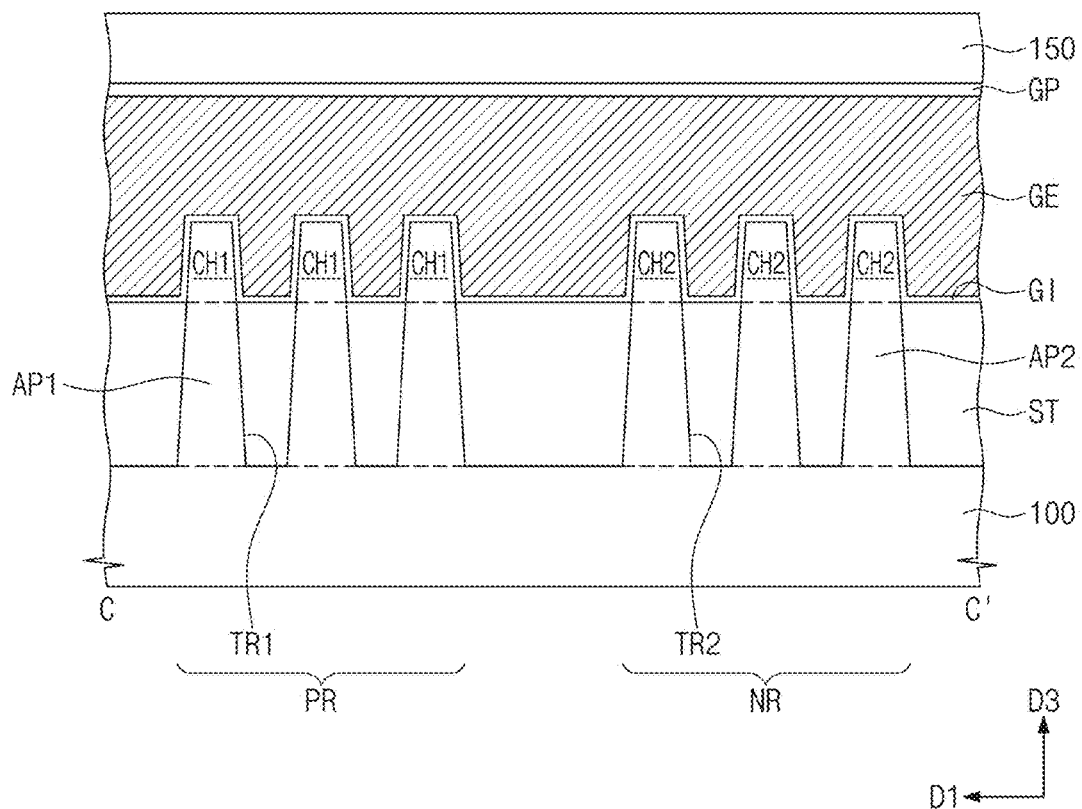
Figure 3:
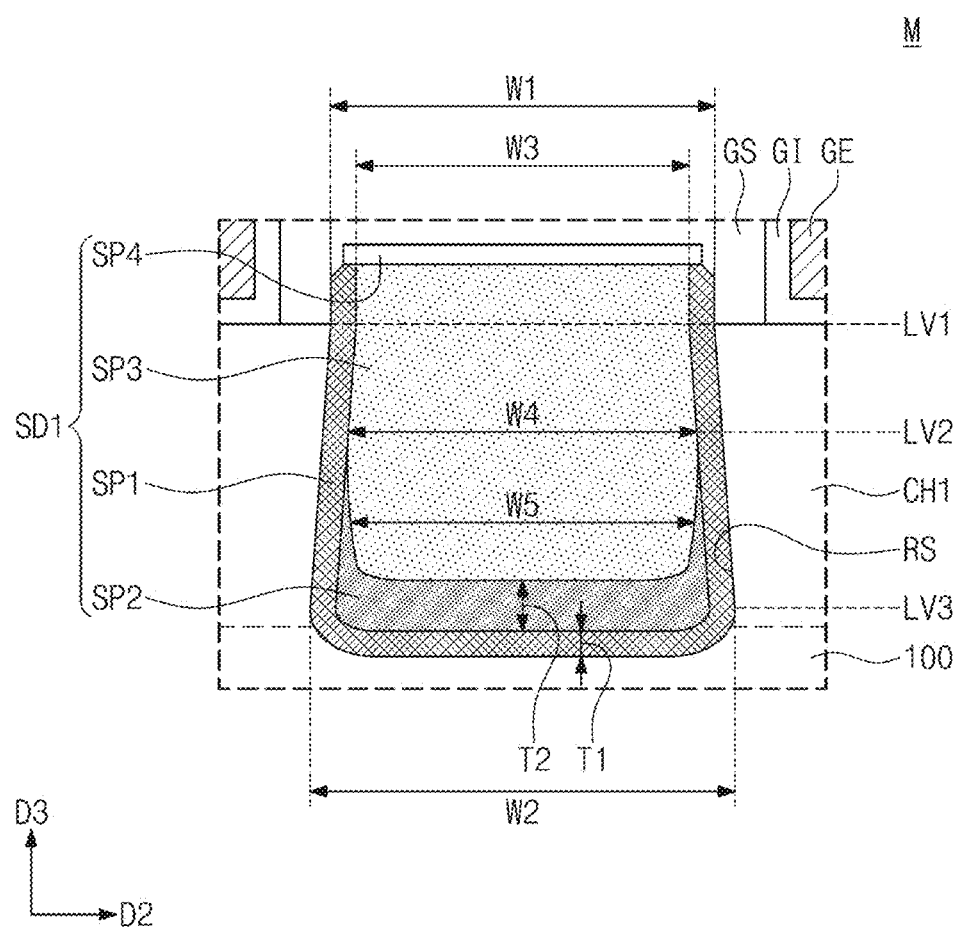
FIG. 3 is an enlarged cross-sectional view of section M of FIG. 2A.

FIG. 1 is a plan view for explaining a semiconductor device according to some example embodiments of inventive concepts. FIGS. 2A, 2B, 2C, and 2D are cross-sectional views respectively taken along lines A-A', B-B', C-C', and D-D' of FIG. 1. FIG. 3 is an enlarged cross-sectional view of section M of FIG. 2A.

Referring to FIGS. 1, 2A to 2D, and 3, device isolation layers ST may be provided at an upper portion of a substrate 100. The device isolation layers ST may define a PMOSFET region PR and an NMOSFET region NR. The substrate 100 may be a compound semiconductor substrate or a semiconductor substrate including silicon, germanium, silicon-germanium, etc. For example, the substrate 100 may be a silicon substrate. The device isolation layers ST may include an insulating material such as a silicon oxide layer.

The PMOSFET region PR and the NMOSFET region NR may be spaced apart from each other across the device isolation layer ST in a first direction D1 parallel to a top surface of the substrate 100. The PMOSFET region PR and the NMOSFET region NR may extend in a second direction D2 crossing the first direction D1. Although not shown in figures, the device isolation layer ST between the PMOSFET and NMOSFET regions PR and NR may be deeper than the device isolation layers ST between active patterns AP1 and AP2.

The PMOSFET and NMOSFET regions PR and NR may form a memory cell region for storing data. For example, the memory cell region of the substrate 100 may be provided thereon with memory cell transistors forming a plurality of SRAM cells. The PMOSFET and NMOSFET regions PR and NR may include at least one of the memory cell transistors.

Alternatively, the PMOSFET and NMOSFET regions PR and NR may be a logic cell region that includes thereon logic transistors constituting (and/or forming) a logic circuit of a semiconductor device. For example, the logic cell region of the substrate 100 may be provided thereon with logic transistors constituting (and/or forming) a processor core or an I/O terminal. The PMOSFET and NMOSFET regions PR and NR may include at least one of the logic transistors. Inventive concepts, however, are not limited thereto.

The PMOSFET and NMOSFET regions PR and NR may be provided thereon with a plurality of the active patterns AP1 and AP2 extending in the second direction D2. The active patterns AP1 and AP2 may include first active patterns AP1 on the PMOSFET region PR and second active patterns AP2 on the NMOSFET region NR. The first and second active patterns AP1 and AP2 may be portions of the substrate 100 that protrude from the top surface of the substrate 100. The first and second active patterns AP1 and AP2 may be arranged along the first direction D1.

A first trench TR1 may be defined between neighboring first active patterns AP1, and a second trench TR2 may be defined between neighboring second active patterns AP2. The device isolation layers ST may fill the first and second trenches TR1 and TR2. The device isolation layers ST may define the first and second active patterns AP1 and AP2. The device isolation layers ST may directly cover lower sidewalls of the first and second active patterns AP1 and AP2. Three first active patterns AP1 are illustrated on the PMOSFET region PR and three second active patterns AP2 are illustrated on the NMOSFET region NR, but inventive concepts are not limited thereto.

The first and second active patterns AP1 and AP2 may have upper portions positioned higher than top surfaces of the device isolation layers ST. The first and second active patterns AP1 and AP2 may have upper portions that vertically protrude above the device isolation layers ST. Each upper portion of the first and second active patterns AP1 and AP2 may be shaped like a fin protruding between a pair of the device isolation layers ST.

First channel regions CH1 and first source/drain regions SD1 may be provided at the upper portions of the first active patterns AP1. The first source/drain regions SD1 may be p-type impurity regions. Each of the first channel regions CH1 may be interposed between a pair of the first source/drain regions SD1. Second channel regions CH2 and second source/drain regions SD2 may be provided at the upper portions of the second active patterns AP2. The second source/drain regions SD2 may be n-type impurity regions. Each of the second channel regions CH2 may be interposed between a pair of the second source/drain regions SD2.

The first and second source/drain regions SD1 and SD2 may be epitaxial patterns formed by a selective epitaxial growth process. The first and second source/drain regions SD1 and SD2 may have top surfaces positioned higher than those of the first and second channel regions CH1 and CH2. The first and second source/drain regions SD1 and SD2 may include a semiconductor element that is different from that of the substrate 100. For example, the first source/drain regions SD1 may include a semiconductor element whose lattice constant is greater than that of a semiconductor element included in the substrate 100. As a result, the first source/drain regions SD1 may provide the first channel regions CH1 with a compressive stress. For example, the second source/drain regions SD2 may include a semiconductor element whose lattice constant is equal to or smaller than that of a semiconductor element included in the substrate 100. As a result, the second source/drain regions SD2 may provide the second channel regions CH2 with a tensile stress.

Gate electrodes GE may be provided to extend in the first direction D1 while running across the first and second active patterns AP1 and AP2. The gate electrodes GE may be spaced apart from each other in the second direction D2. The gate electrodes GE may vertically overlap the first and second channel regions CH1 and CH2. Each of the gate electrodes GE may surround the top surface and opposite sidewalls of each of the first and second channel regions CH1 and CH2 (see FIG. 2C). For example, the gate electrodes GE may include one or more of conductive metal nitride (e.g., titanium nitride or tantalum nitride) and metal (e.g., titanium, tantalum, tungsten, copper, or aluminum).

A pair of gate spacers GS may be disposed on opposite sidewalls of each of the gate electrodes GE. The gate spacers GS may extend in the first direction D1 along the gate electrodes GE. The gate spacers GS may have top surfaces higher than those of the gate electrodes GE. The top surfaces of the gate spacers GS may be coplanar with that of a first interlayer dielectric layer 140 which will be discussed below. The gate spacers GS may include one or more of $SiO_2$, SiCN, SiCON, and SiN. Alternatively, the gate spacers GS may include a multiple layer consisting of two or more of $SiO_2$, SiCN, SiCON, and SiN.

Gate dielectric patterns GI may be interposed between the gate electrodes GE and the first active patterns AP1 and between the gate electrodes GE and the second active patterns AP2. Each of the gate dielectric patterns GI may extend along a bottom surface of each of the gate electrodes GE. Each of the gate dielectric patterns GI may cover the top surface and the opposite sidewalls of each of the first and second channel regions CH1 and CH2. The gate dielectric patterns GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern GP may be provided on each of the gate electrodes GE. The gate capping patterns GP may extend in the first direction D1 along the gate electrodes GE. The gate capping patterns GP may include a material having an etch selectivity to first and second interlayer dielectric layers 140 and 150 which will be discussed below. In detail, the gate capping patterns GP may include one or more of SiON, SiCN, SiCON, and SiN.

A first interlayer dielectric layer 140 may be provided on the substrate 100. The first interlayer dielectric layer 140 may cover the gate spacers GS, the first source/drains SD1, and the second source/drain regions SD2. The first interlayer dielectric layer 140 may have a top surface substantially coplanar with top surfaces of the gate capping patterns GP and the top surfaces of the gate spacers GS. The first interlayer dielectric layer 140 may be provided thereon with a second interlayer dielectric layer 150 covering the gate capping patterns GP.

In addition, a pair of the gate electrodes GE may be provided therebetween with one or more contacts AC that penetrate the first and second interlayer dielectric layers 140 and 150 and are electrically connected to the first and second source/drain regions SD1 and SD2. For example, each of the contacts AC may be connected to a plurality of the first or second source/drain regions SD1 or SD2. Alternatively, as not shown in figures, at least one contact AC may be connected to a single first or second source/drain region SD1 or SD2, but not especially limited to.

Each of the contacts AC may include a conductive pillar 165 and a barrier layer 160 surrounding the conductive pillar 165. The barrier layer 160 may cover sidewalls and a bottom surface of the conductive pillar 165. The conductive pillar 165 may include a metallic material, for example, tungsten. The barrier layer 160 may include metal/metal nitride, for example, Ti/TiN.

As not shown in figures, silicide layers may be interposed between the contacts AC and the first source/drain regions SD1 and between the contacts AC and the second source/drain regions SD2. That is, the contacts AC may be electrically connected through the silicide layers to the first and second source/drain regions SD1 and SD2. The silicide layers may include metal silicide, for example, one or more of titanium silicide, tantalum silicide, and tungsten silicide.

The first source/drain regions SD1 will be discussed in detail with reference back to FIGS. 2A, 2D, and 3.

The first source/drain regions SD1 may fill recesses RS formed at the upper portions of the first active patterns AP1. The first source/drain region SD1 may have a maximum width W2 in the second direction D2 at a third level LV3 between the top surface (e.g., a first level LV1) of the first channel region CH1 and a bottom surface of the first source/drain region SD1. The first source/drain region SD1 may have a width in the second direction D2 that gradually increases with approaching the third level LV3 from the top surface of the first source/drain region SD1. The width in the second direction D2 of the first source/drain region SD1 may gradually decrease with approaching the bottom surface of the first source/drain region SD1 from the third level LV3. The first source/drain region SD1 may have an upper width W1 in the second direction D2 at its upper portion and a lower width in the second direction D2 at its lower portion. The upper width W1 may be smaller than the lower width (e.g., the maximum width W2). The upper portion of the first source/drain region SD1 may be positioned higher than the first level LV1. The lower portion of the first source/drain region SD1 may be positioned lower than the first level LV1.

Each of the first source/drain regions SD1 may include first to fourth semiconductor patterns SP1 to SP4 that are sequentially stacked. The first semiconductor pattern SP1 may cover an inner sidewall of the recess RS. The first semiconductor pattern SP1 may be shaped like U as viewed in cross-section taken along the second direction D2. For example, the first semiconductor pattern SP1 may be conformally formed to have a uniform thickness T1 on the inner sidewall of the recess RS.

The second semiconductor pattern SP2 may be provided on the first semiconductor pattern SP1. The second semiconductor pattern SP2 may partially cover an inner sidewall of the first semiconductor pattern SP1. The second semiconductor pattern SP2 may be shaped like U as viewed in cross-section taken along the second direction D2. The second semiconductor pattern SP2 may have a thickness T2 measured from a floor of the recess RS that may be greater than the thickness T1 of the first semiconductor pattern SP1. Alternatively, as not shown in figures, the second semiconductor pattern SP2 may completely cover the inner sidewall of the first semiconductor pattern SP1.

The third semiconductor pattern SP3 may be provided on the second semiconductor pattern SP2. The third semiconductor pattern SP3 may fill the recess RS. The third semiconductor pattern SP3 may have a volume greater than that of each of the first, second, and fourth semiconductor patterns SP1, SP2, and SP4. The third semiconductor pattern SP3 may have an upper portion in directly contact with an upper inner sidewall of the first semiconductor pattern SP1.

The third semiconductor pattern SP3 may have a maximum width W4 in the second direction D2 at a second level LV2 between the top surface (e.g., the first level LV1) of the first channel region CH1 and a bottom surface of the third semiconductor pattern SP3. The second level LV2 may be an intermediate level between the top surface (i.e. the first level LV1) of the first channel region CH1 and the bottom surface of the third semiconductor pattern SP3. The third semiconductor pattern SP3 may have a width in the second direction D2 that gradually increases with approaching the second level LV2 from a top surface of the third semiconductor pattern SP3. The width in the second direction D2 of the third semiconductor pattern SP3 may gradually decrease with approaching the bottom surface of the third semiconductor pattern SP3 from the second level LV2. The third semiconductor pattern SP3 may have a width W4 at the second level LV2 and a width W5 at below the second level LV2. The width W4 may be greater than the width W5. The third semiconductor pattern SP3 may have an upper width W3 in the second direction D2 at its upper portion and a lower width in the second direction D2 at its lower portion. The upper width W3 may be smaller than the lower width (e.g., the width W4 or the width W5). The upper portion of the third semiconductor pattern SP3 may be positioned higher than the first level LV1. The lower portion of the third semiconductor pattern SP3 may be positioned lower than the first level LV1.

The fourth semiconductor pattern SP4 may be provided on the third semiconductor pattern SP3. The fourth semiconductor pattern SP4 may conformally cover an exposed surface of the third semiconductor pattern SP3.

Each of the first to third semiconductor patterns SP1 to SP3 may include a semiconductor element whose lattice constant is greater than that of a semiconductor element included in the substrate 100. For example, when the substrate 100 includes silicon (Si), each of the first to third semiconductor patterns SP1 to SP3 may include silicon-germanium (SiGe). Germanium (Ge) may have a lattice constant greater than that of silicon (Si).

The first semiconductor pattern SP1 may act as a buffer layer interposed between the substrate 100 and any one of the second and third semiconductor patterns SP2 and SP3. The first semiconductor pattern SP1 may contain germanium (Ge) having a relatively low concentration. For example, the first semiconductor pattern SP1 may contain a germanium (Ge) content of about 15 at % to about 25 at %. The second semiconductor pattern SP2 may contain germanium (Ge) whose content is greater than that of germanium (Ge) contained in the first semiconductor pattern SP1. For example, the second semiconductor pattern SP2 may contain a germanium (Ge) content of about 25 at % to about 50 at %. The third semiconductor pattern SP3 may contain germanium (Ge) whose content is greater than that of germanium (Ge) contained in the second semiconductor pattern SP2. For example, the third semiconductor pattern SP3 may contain a germanium (Ge) content of about 50 at % to about 75 at %.

The fourth semiconductor pattern SP4 may act as a capping layer for protecting the third semiconductor pattern SP3. The fourth semiconductor pattern SP4 may include the same semiconductor element as that of the substrate 100. For example, the fourth semiconductor pattern SP4 may include single crystalline silicon (Si). The fourth semiconductor pattern SP4 may contain a silicon (Si) content of about 95 at % to about 100 at %.

In some embodiments, the third semiconductor pattern SP3 may have its volume and germanium content that are higher than any other semiconductor pattern of the first source/drain region SD. In addition, the third semiconductor pattern SP3 may have a convex shape protruding toward the first channel region CH1. As a result, the first source/drain regions SD1 may provide the first channel region CH1 therebetween with a relatively high compressive stress.

FIGS. 4, 6, 8, 16, 18, 20, and 22 are plan views for explaining a method of manufacturing a semiconductor device according to some example embodiments of inventive concepts. FIGS. 5A, 7A, 9A, 17A, 19A, 21A, and 23A are cross-sectional views taken along line A-A' of FIGS. 4, 6, 8, 16, 18, 20, and 22, respectively. FIGS. 5B, 7B, 9B, 17B, 19B, 21B, and 23B are cross-sectional views taken along line B-B' of FIGS. 4, 6, 8, 16, 18, 20, and 22, respectively. FIGS. 7C, 9C, 17C, 19C, 21C, and 23C are cross-sectional views taken along line C-C' of FIGS. 6, 8, 16, 18, 20, and 22, respectively. FIGS. 9D, 17D, 19D, 21D, and 23D are cross-sectional views taken along line D-D' of FIGS. 8, 16, 18, 20, and 22, respectively.

Figure 4:
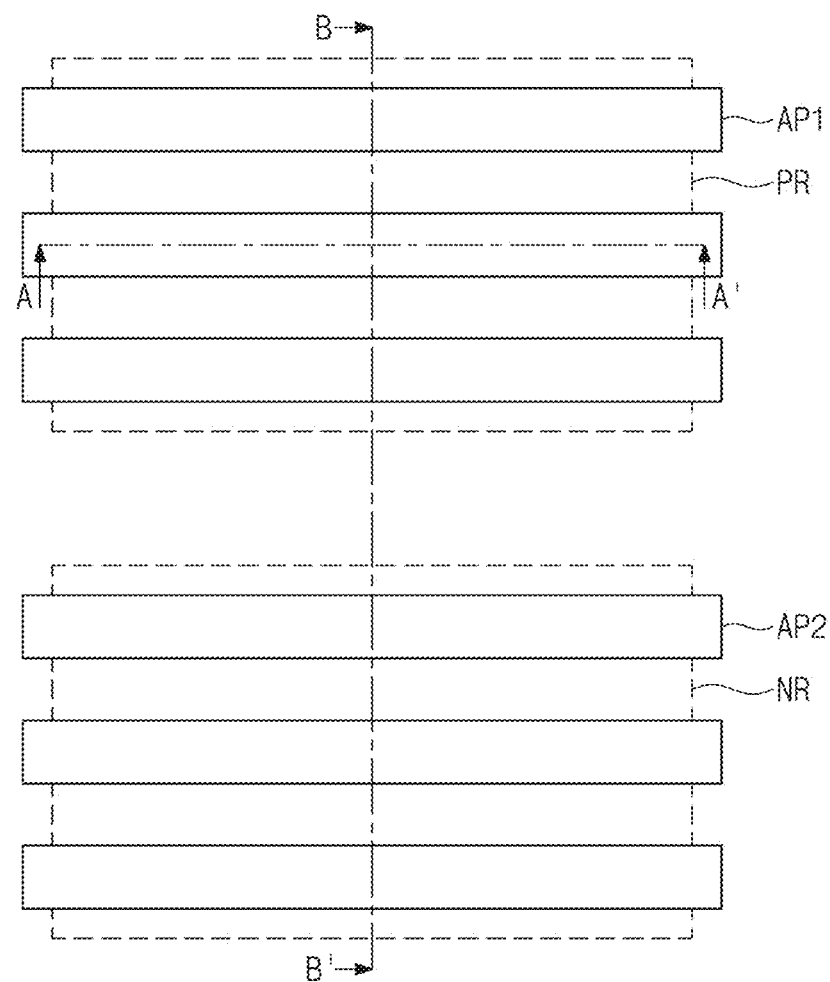
FIGS. 4, 6, 8, 16, 18, 20, and 22 are plan views for explaining a method of manufacturing a semiconductor device according to some example embodiments of inventive concepts.
Figure 4:
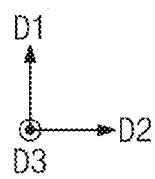
Figure 5A:
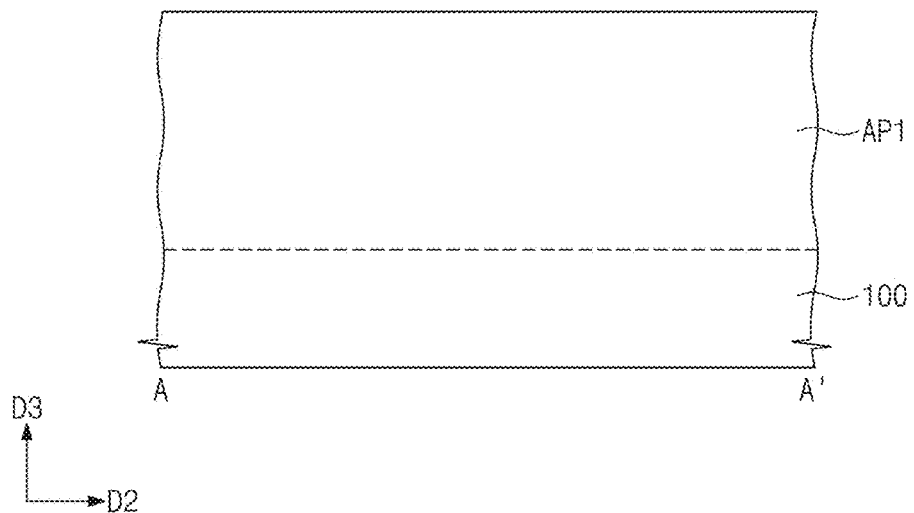
FIGS. 5A, 7A, 9A, 17A, 19A, 21A, and 23A are cross-sectional views taken along line A-A' of FIGS. 4, 6, 8, 16, 18, 20, and 22, respectively.
Figure 5B:
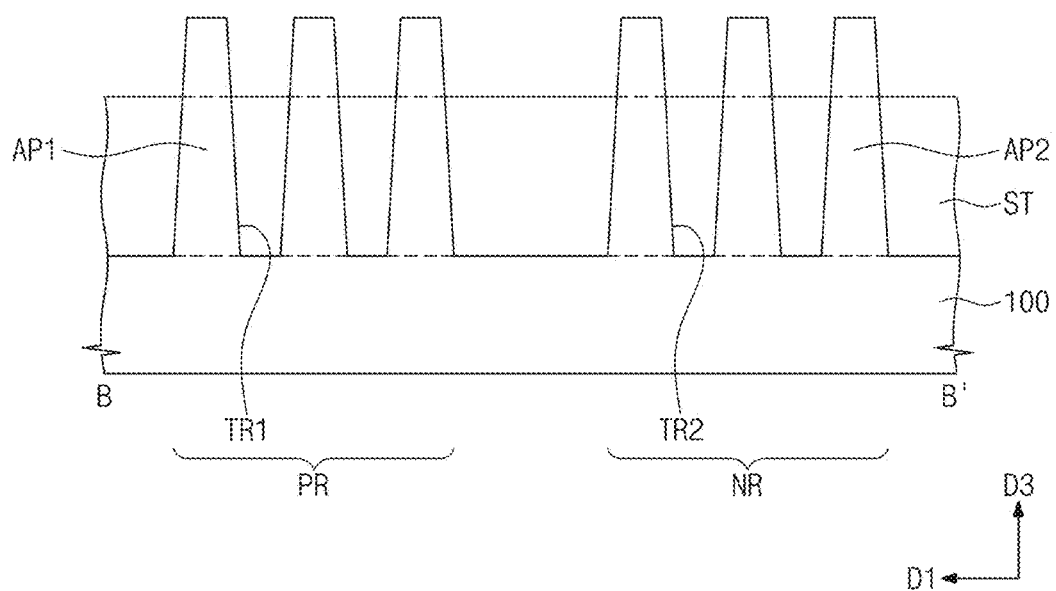
FIGS. 5B, 7B, 9B, 17B, 19B, 21B, and 23B are cross-sectional views taken along line B-B' of FIGS. 4, 6, 8, 16, 18, 20, and 22, respectively.
Figure 6:
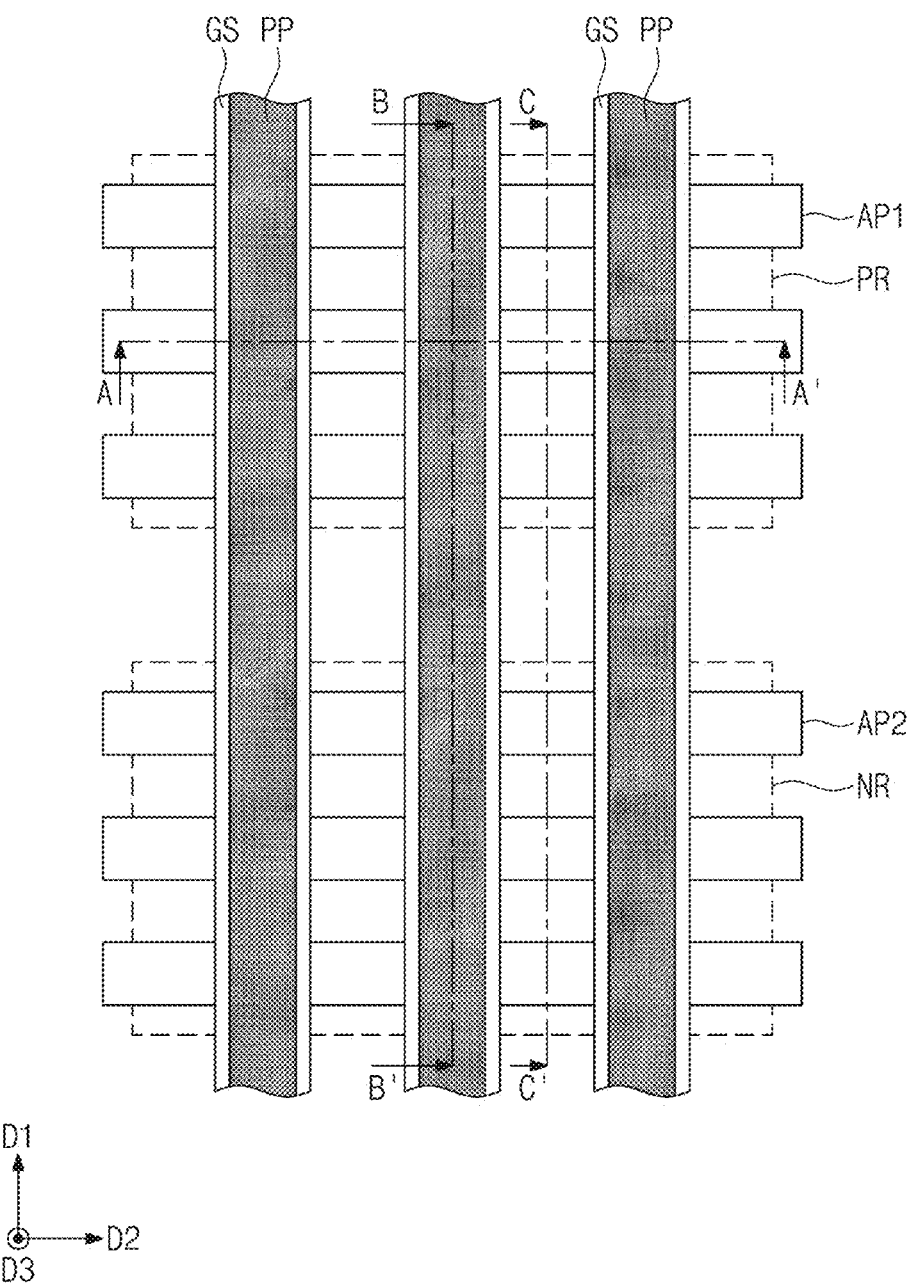
Figure 7A:
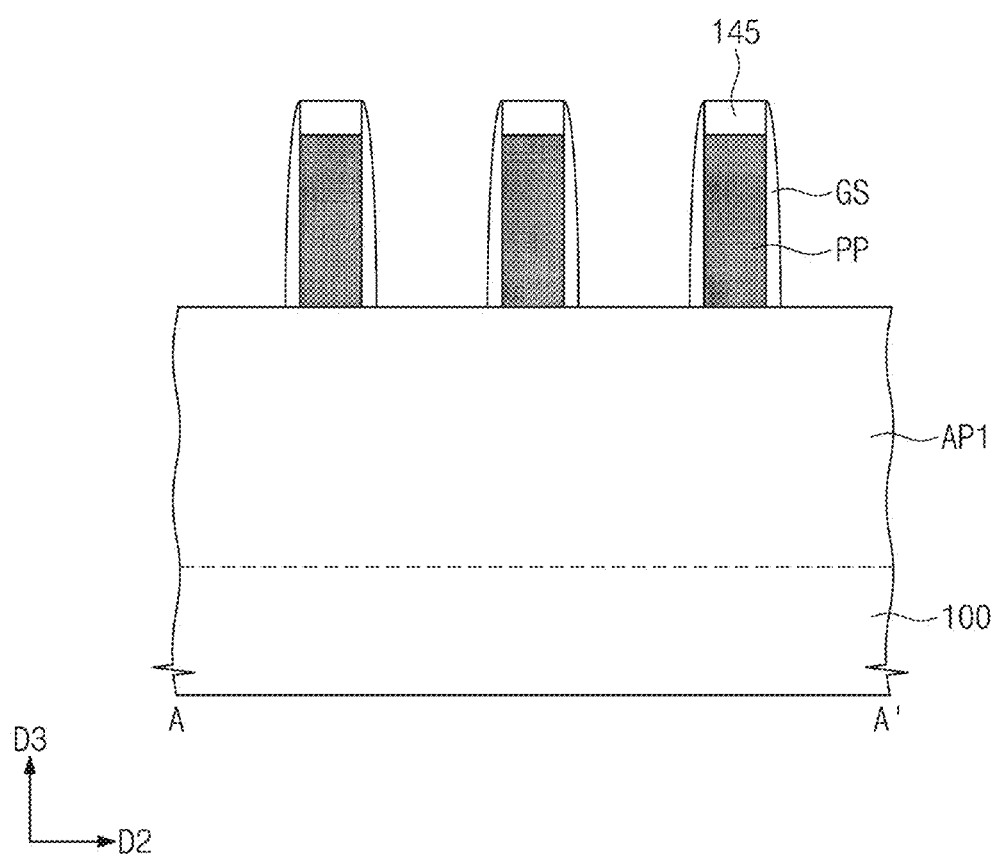
Figure 7B:
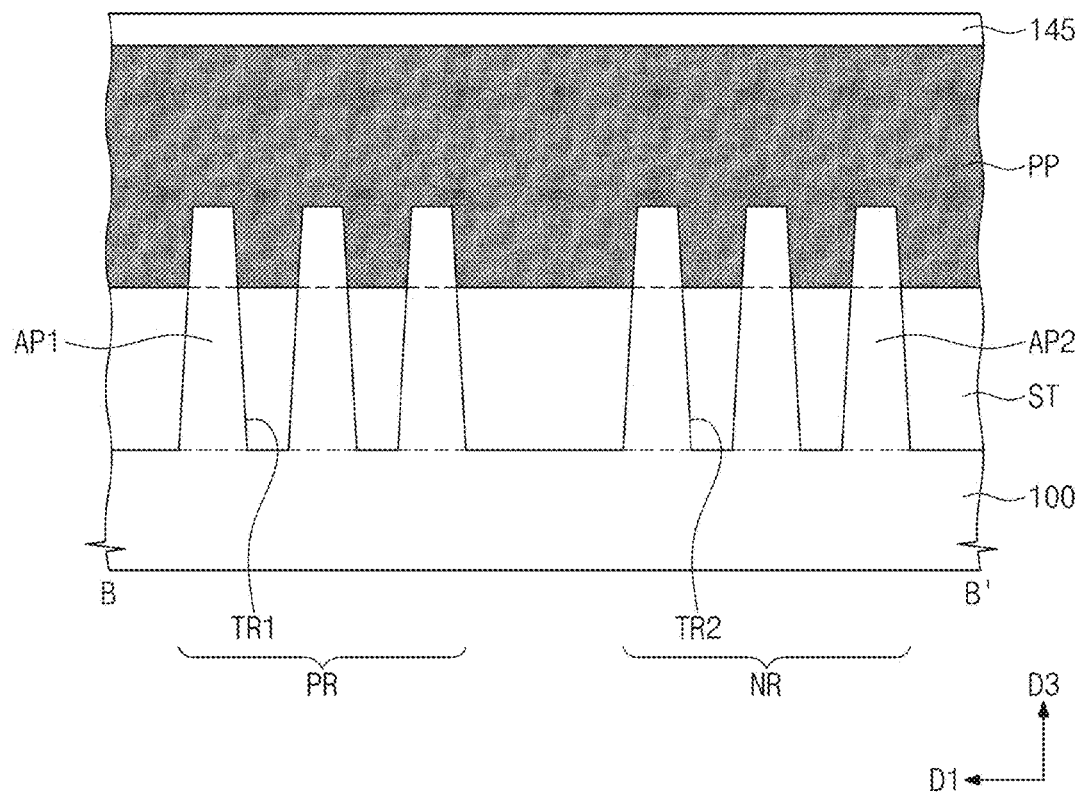
Figure 7C:
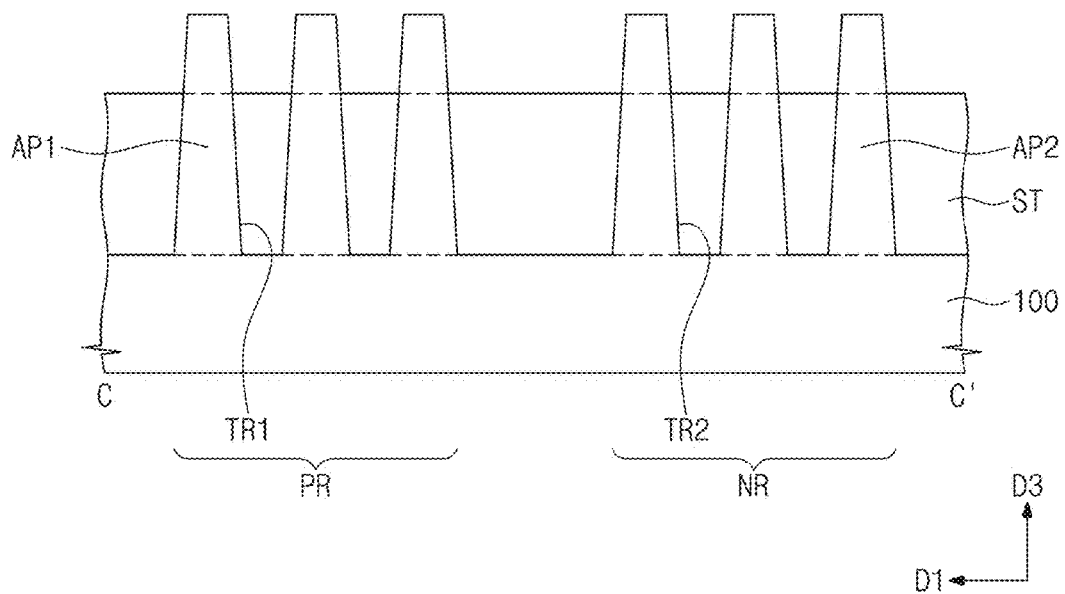
FIGS. 7C, 9C, 17C, 19C, 21C, and 23C are cross-sectional views taken along line C-C' of FIGS. 6, 8, 16, 18, 20, and 22, respectively.
Figure 8:
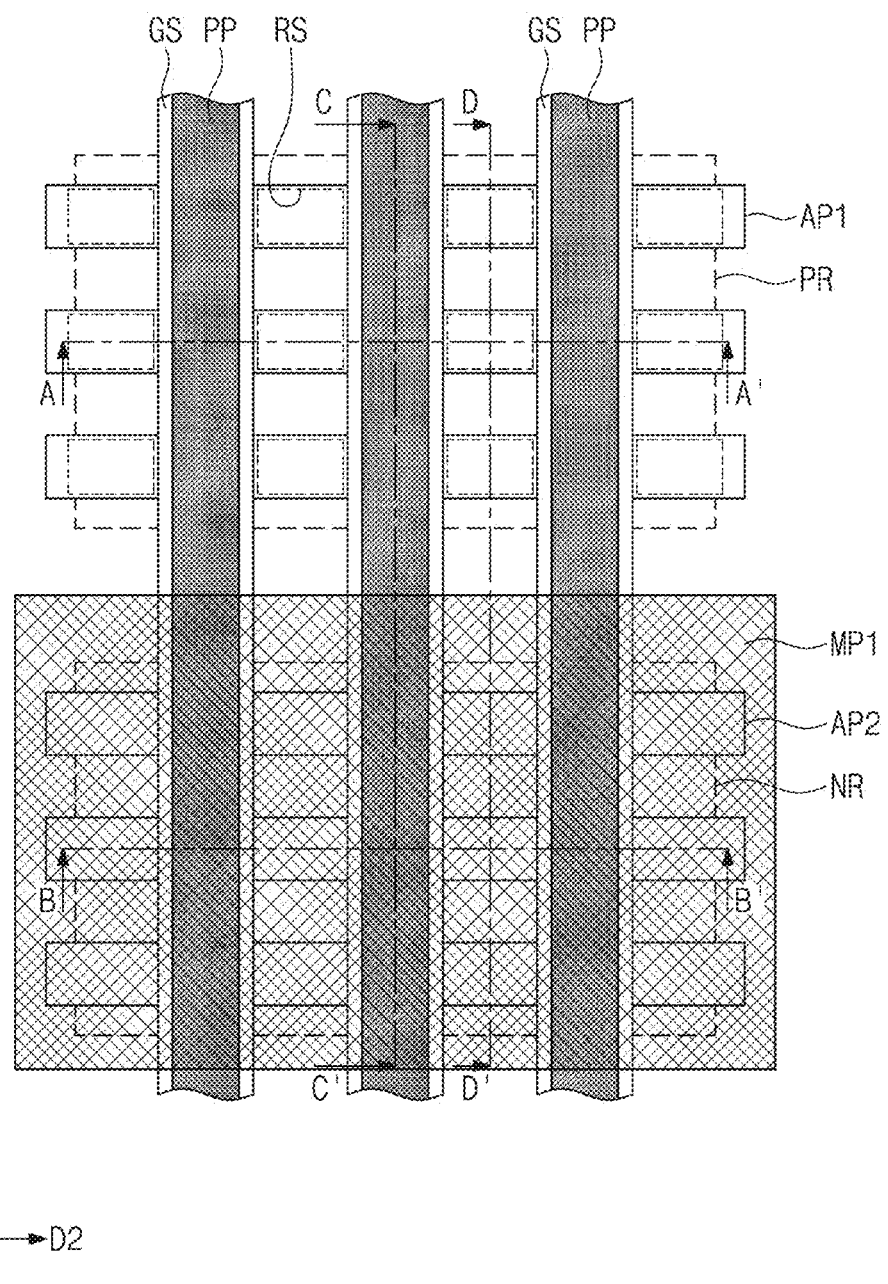
Figure 9A:
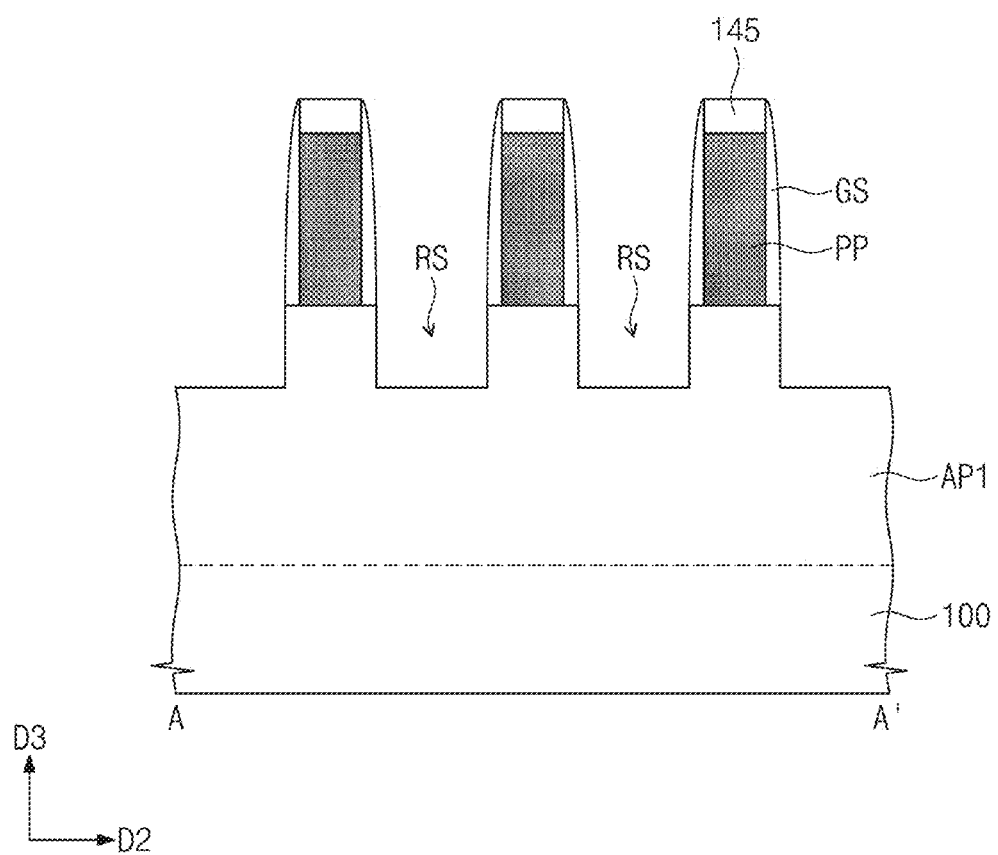
Figure 9B:
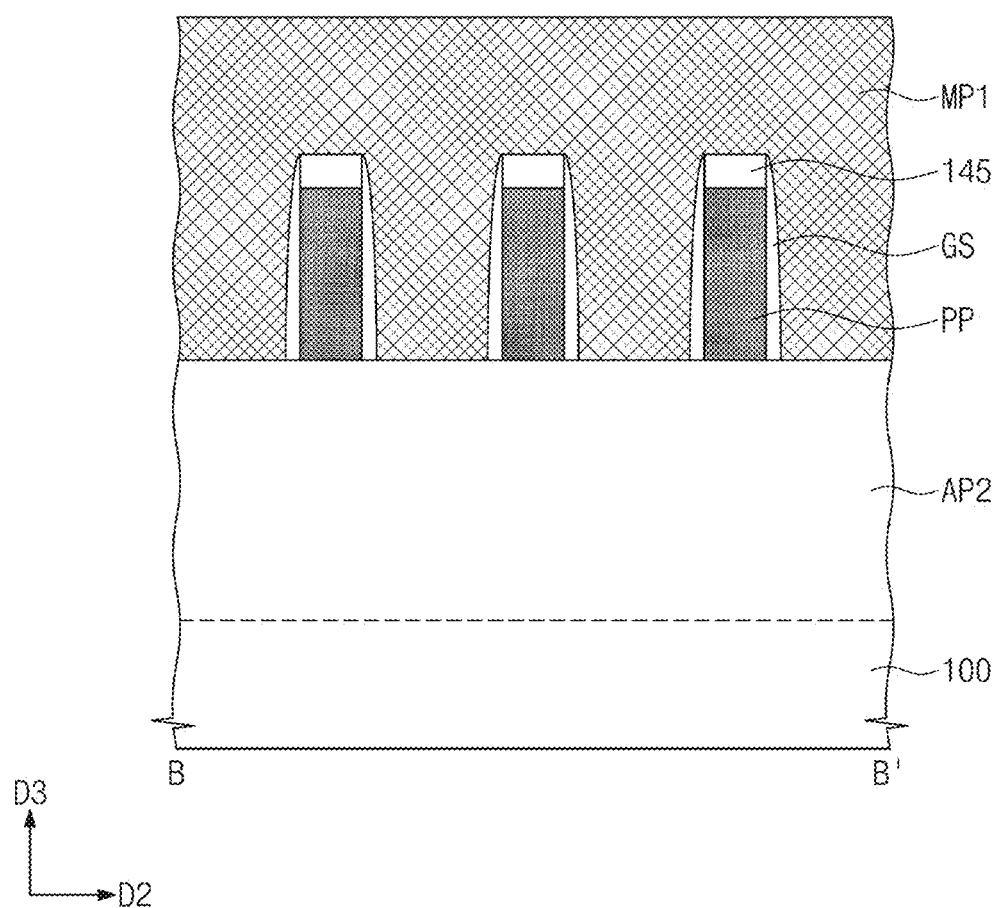
Figure 9C:
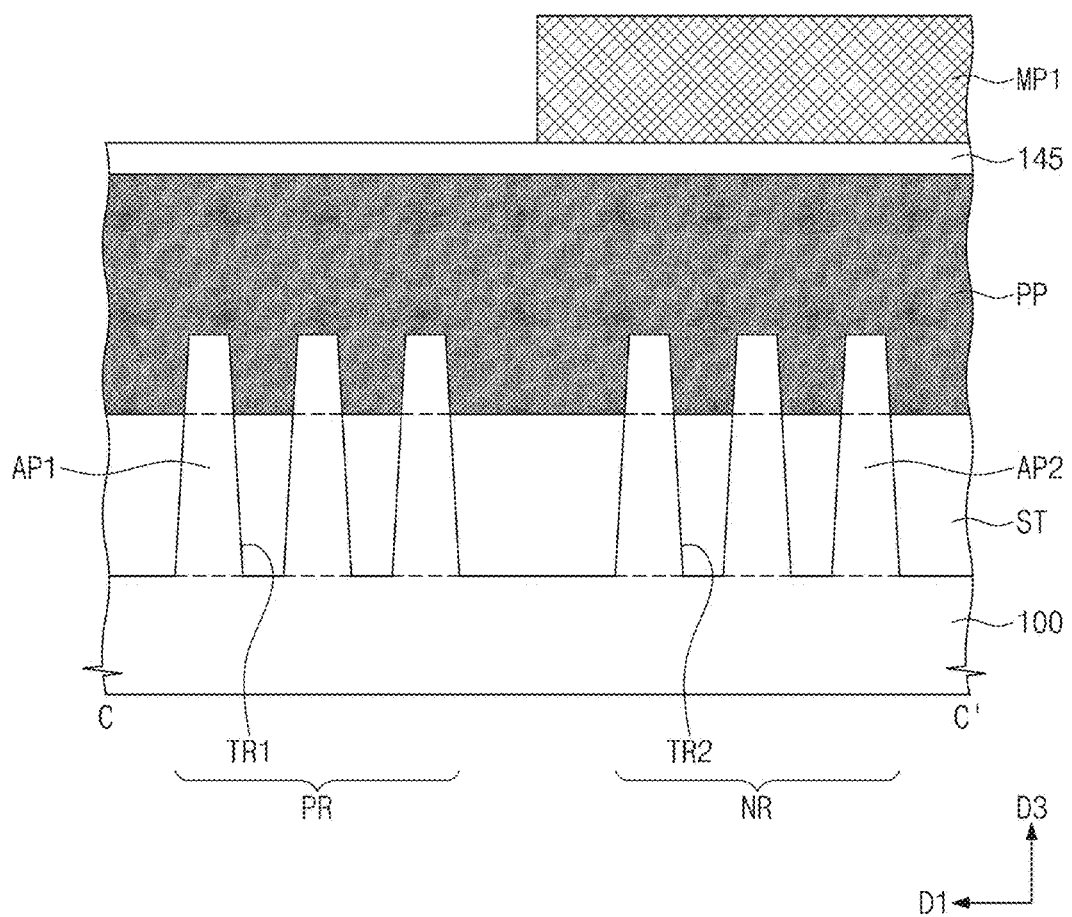
Figure 9D:
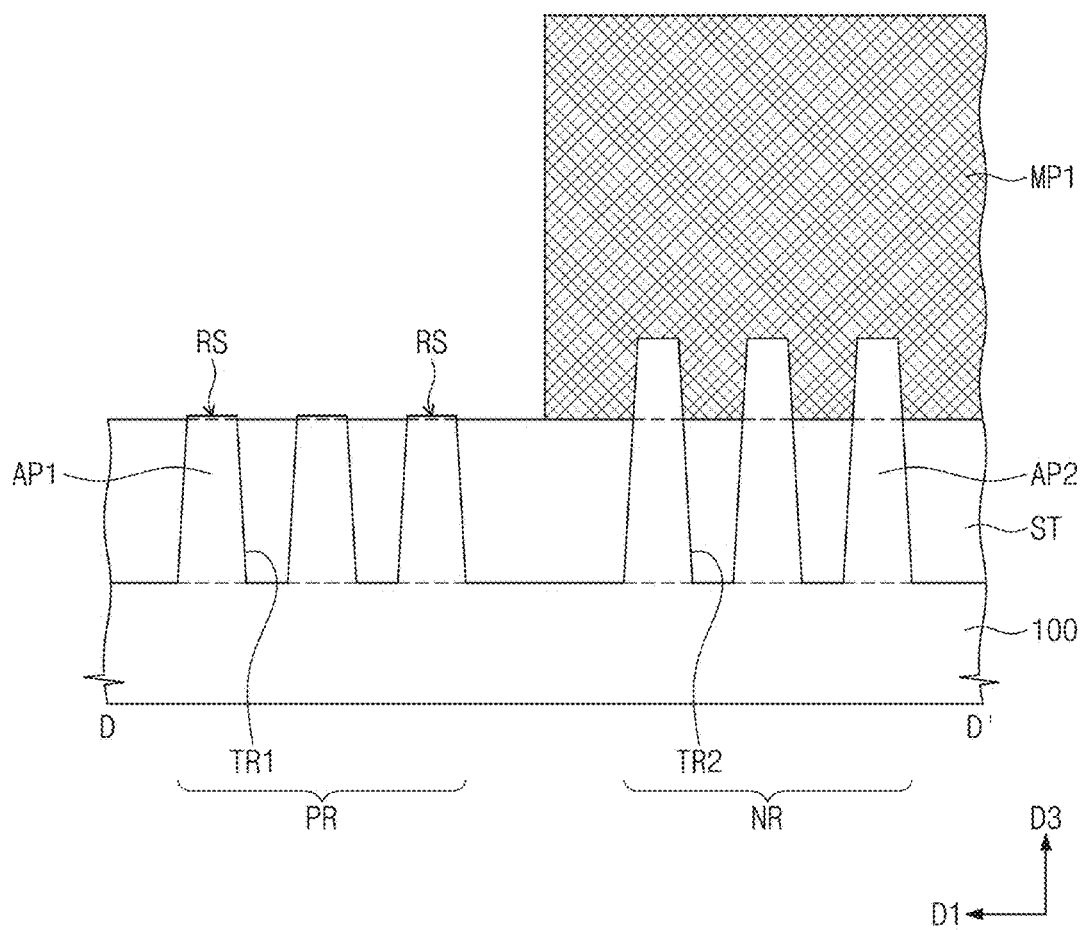
FIGS. 9D, 17D, 19D, 21D, and 23D are cross-sectional views taken along line D-D' of FIGS. 8, 16, 18, 20, and 22, respectively.

Referring to FIGS. 4, 5A, and 5B, a substrate 100 may be patterned to form active patterns AP1 and AP2. The active patterns AP1 and AP2 may include first active patterns AP1 and second active patterns AP2. In detail, the formation of the first and second active patterns AP1 and AP2 may include forming mask patterns on the substrate 100 and anisotropically etching the substrate 100 using the mask patterns as an etch mask. First trenches TR1 may be formed between the first active patterns AP1. Second trenches TR2 may be formed between the second active patterns AP2. The substrate 100 may be a compound semiconductor substrate or a semiconductor substrate including silicon, germanium, silicon-germanium, etc. For example, the substrate 100 may be a silicon substrate.

Device isolation layers ST may be formed to fill the first and second trenches TR1 and TR2. In detail, an insulation layer (e.g., a silicon oxide layer) may be formed to fill all of the first and second trenches TR1 and TR2. Thereafter, the insulation layer may be recessed until exposing upper portions of the first and second active patterns AP1 and AP2. The first active patterns AP1 may constitute (and/or form) a PMOSFET region PR, and the second active patterns AP2 may constitute (and/or form) an NMOSFET region NR.

Referring to FIGS. 6 and 7A to 7C, sacrificial patterns PP may be formed to run across the first and second active patterns AP1 and AP2. The sacrificial patterns PP may be formed to have a shape of line or bar extending in a first direction D1. In detail, the formation of the sacrificial patterns P may include forming a sacrificial layer on an entire surface of the substrate 100, forming hardmask patterns 145 on the sacrificial layer, and patterning the sacrificial layer using the hardmask patterns 145 as an etch mask. The sacrificial layer may include a polysilicon layer.

A pair of gate spacers GS may be formed on opposite sidewalls of each of the sacrificial patterns PP. The formation of the gate spacers GS may include conformally forming a spacer layer on the entire surface of the substrate 100 and anisotropically etching the spacer layer. The spacer layer may include one or more of $SiO_2$, SiCN, SiCON, and SiN. Alternatively, the spacer layer may include a multiple layer consisting of two or more of $SiO_2$, SiCN, SiCON, and SiN.

Referring to FIGS. 8 and 9A to 9C, a first mask pattern MP1 may be formed to cover the NMOSFET region NR. The first mask pattern MP1 may selectively expose the PMOSFET region PR. A first etching process may be performed on the first active patterns AP1. The first etching process may selectively etch the first active patterns AP1 on opposite sides of each of the sacrificial patterns PP such that recesses RS may be formed. The first etching process may be performed employing the first mask pattern MP1, the hardmask patterns 145, and the gate spacers GS as an etch mask. The first etching process may be an anisotropic etching process.

The first etching process may be performed until floors of the recesses RS approach top surfaces of the device isolation layers ST. The floors of the recesses RS formed during the first etching process may be positioned higher than the top surfaces of the device isolation layers ST.

Figure 10:
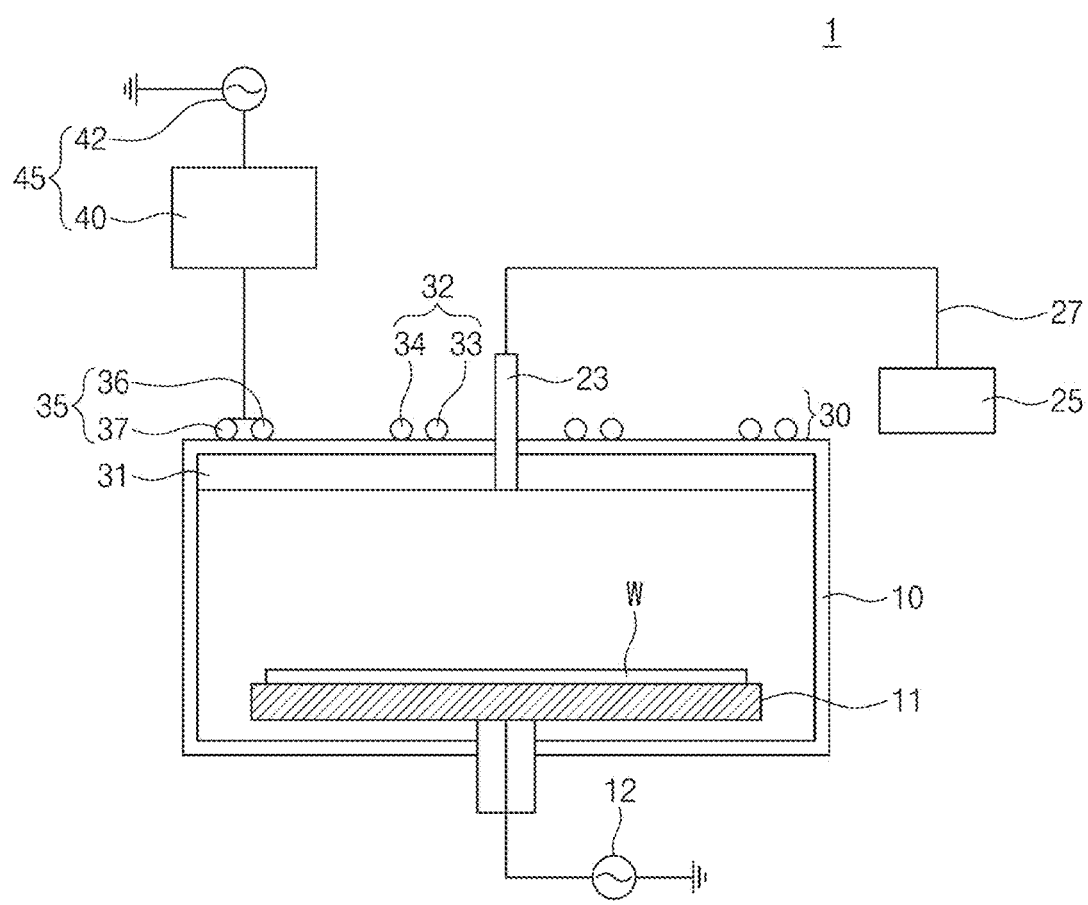
FIG. 10 is a conceptual view of an etching apparatus used for a second etching process according to some example embodiments of inventive concepts.
Figure 11:
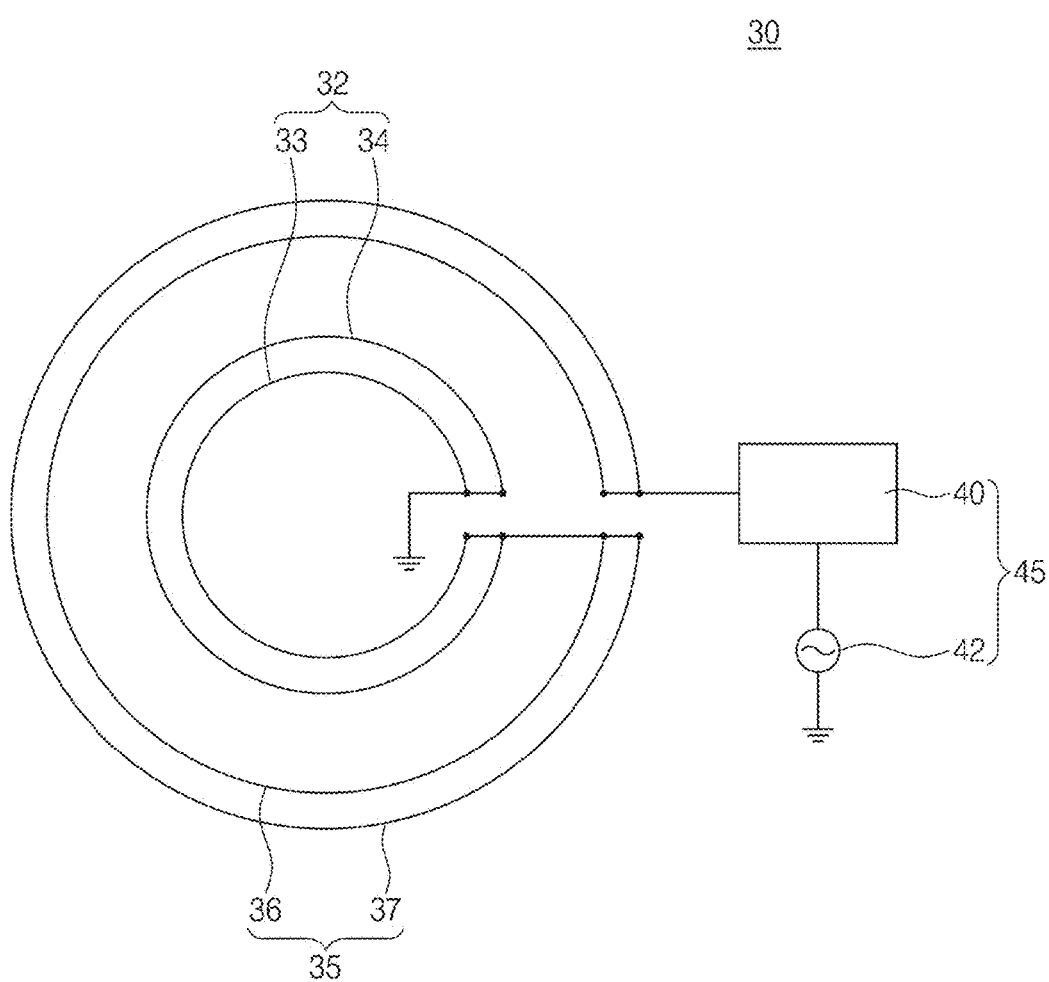
FIG. 11 is a plan view illustrating an example of an ICP antenna shown in FIG. 10.

FIG. 10 is a conceptual view of an etching apparatus used for a second etching process according to some example embodiments of inventive concepts. FIG. 11 is a plan view illustrating an example of an ICP antenna shown in FIG. 10.

It will be described an etching apparatus 1 used for a second etching process discussed later with reference to FIGS. 10 and 11. The etching apparatus 1 including a process chamber 10 may perform a second etching process according to some example embodiments of inventive concepts. The etching apparatus 1 may be an etching facility that uses an inductively coupled plasma (ICP) source. In more detail, the etching apparatus 1 according to some example embodiments of inventive concepts may include an ICP antenna 30 that generates an inductively coupled plasma.

The etching apparatus 1 may include at its lower portion a susceptor 11 on which a wafer W is placed. The susceptor 11 may be connected to a RF bias 12. In this description, the term "RF bias" may hereinafter denote the RF bias 12 connected to the susceptor 11. For example, the RF bias 12 may provide the susceptor 11 with a radio frequency of about 13.56 MHz to about 27.56 MHz. When the susceptor 11 is supplied by the RF bias 12 with a pulsed bias (e.g., a pulse mode) which will be discussed below, a pulse frequency may be in the range from about 100 kHz to about 200 kHz. A direct current source may be used for the susceptor 11 to electrostatically adsorb the wafer W. The susceptor 11 may be connected to a heater.

The chamber 10 may be associated with a gas supply 25 to receive a treatment gas from the gas supply 25. For example, the treatment gas may include a plasma excitation gas and an etching gas. The plasma excitation gas may include one or more of Ar, He, Ne, Kr, and Xe. The etching gas may include CF-based etching source. For example, the CF-based etching source may include one or more of $CF_4$, $C_2F_6$, and $C_4F_8$, but inventive concepts are not limited thereto. The etching gas may further include silicon tetrachloride ($SiCl_4$). The etching gas may selectively further include an oxidizing gas. The oxidizing gas may include $O_2$, $CO_2$, or CO.

The gas supply 25 may be connected through a duct line 27 to a gas supplying part 23 installed at an upper portion of the chamber 10. The gas supplying part 23 may provide the chamber 10 with the treatment gas supplied through the duct line 27.

The etching apparatus 1 may include the ICP antenna 30 that is installed on the chamber 10 and generates an inductively coupled plasma. In addition, the etching apparatus 1 may further include a radio frequency power supply 45 having a radio frequency generator 42 and a matcher 40. The radio frequency generator 42 may generate a radio frequency (e.g., about 13.56 MHz to about 27.56 MHz), and the matcher 40 may transmit the radio frequency to the ICP antenna 30.

A dielectric window 31 may be provided below the ICP antenna 30. The dielectric window 31 may hermetically seal the chamber 10. The dielectric window 31 may produce a travel path of magnetic field generated from the ICP antenna 30. For example, the dielectric window 31 may include quartz, ceramic, or alumina.

Referring again to FIG. 11, the ICP antenna 30 may include a ring-shaped inner antenna segment 32 and a ring-shaped outer antenna segment 35 disposed outside the inner antenna segment 32. The outer antenna segment 35 may be connected in series to the inner antenna segment 32.

The outer antenna segment 35 may have a power end connected to the matcher 40. The outer antenna segment 35 may also have a ground end connected to a power end of the inner antenna segment 32. The inner antenna segment 32 may have a ground end that is grounded state.

The inner antenna segment 32 may include a plurality of inner annular coils 33 and 34 connected to each other in parallel. The outer antenna segment 35 may include a plurality of outer annular coils 36 and 37 connected to each other in parallel.

A radio frequency generated from the radio frequency generator 42 may be applied through the matcher 40 to the power end of the outer antenna segment 35. A magnetic field may be produced by current flowing through the outer and inner antenna segments 35 and 32. The magnetic field may ionize the treatment gas supplied in the chamber 10, and thus a plasma may be created in the chamber 10.

Figure 12:
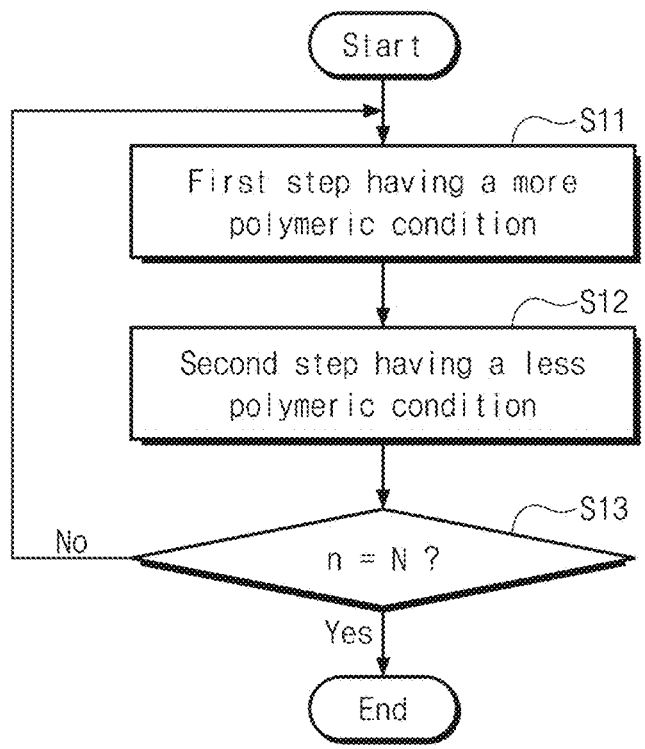
FIG. 12 is a flow chart for explaining a second etching process according to some example embodiments of inventive concepts.
Figure 13:
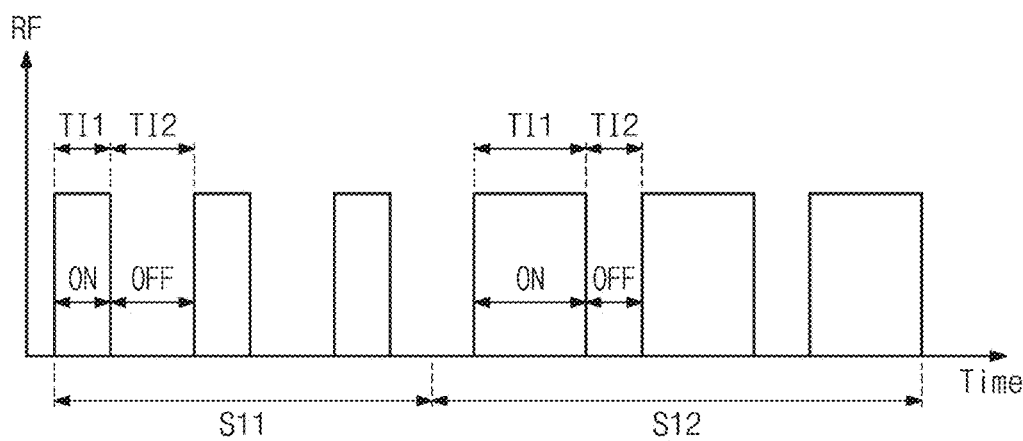
FIG. 13 is a graph for explaining RF bias and duty ratio in first and second steps of a second etching process according to some example embodiments of inventive concepts.
Figure 14:
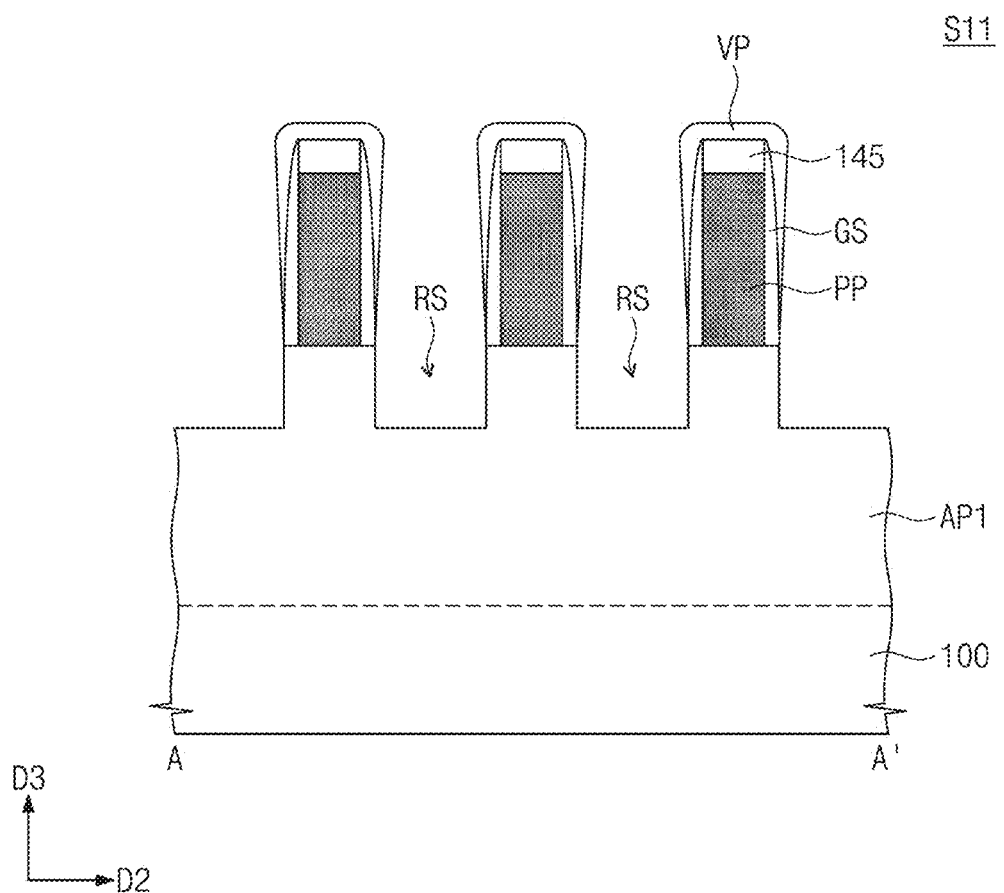
FIG. 14 is a cross-sectional view taken along line A-A' of FIG. 8 for explaining a first step of a second etching process according to some example embodiments of inventive concepts.
Figure 15:
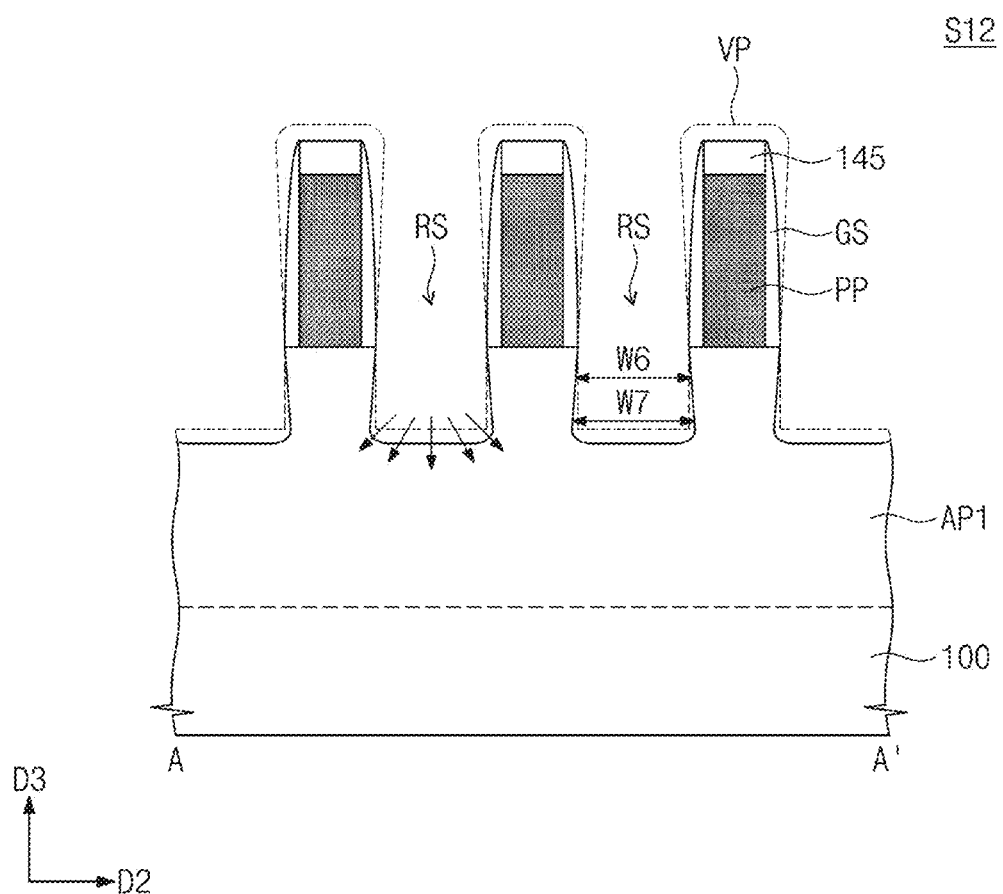
FIG. 15 is a cross-sectional view taken along line A-A' of FIG. 8 for explaining a second step of a second etching process according to some example embodiments of inventive concepts.
Figure 16:
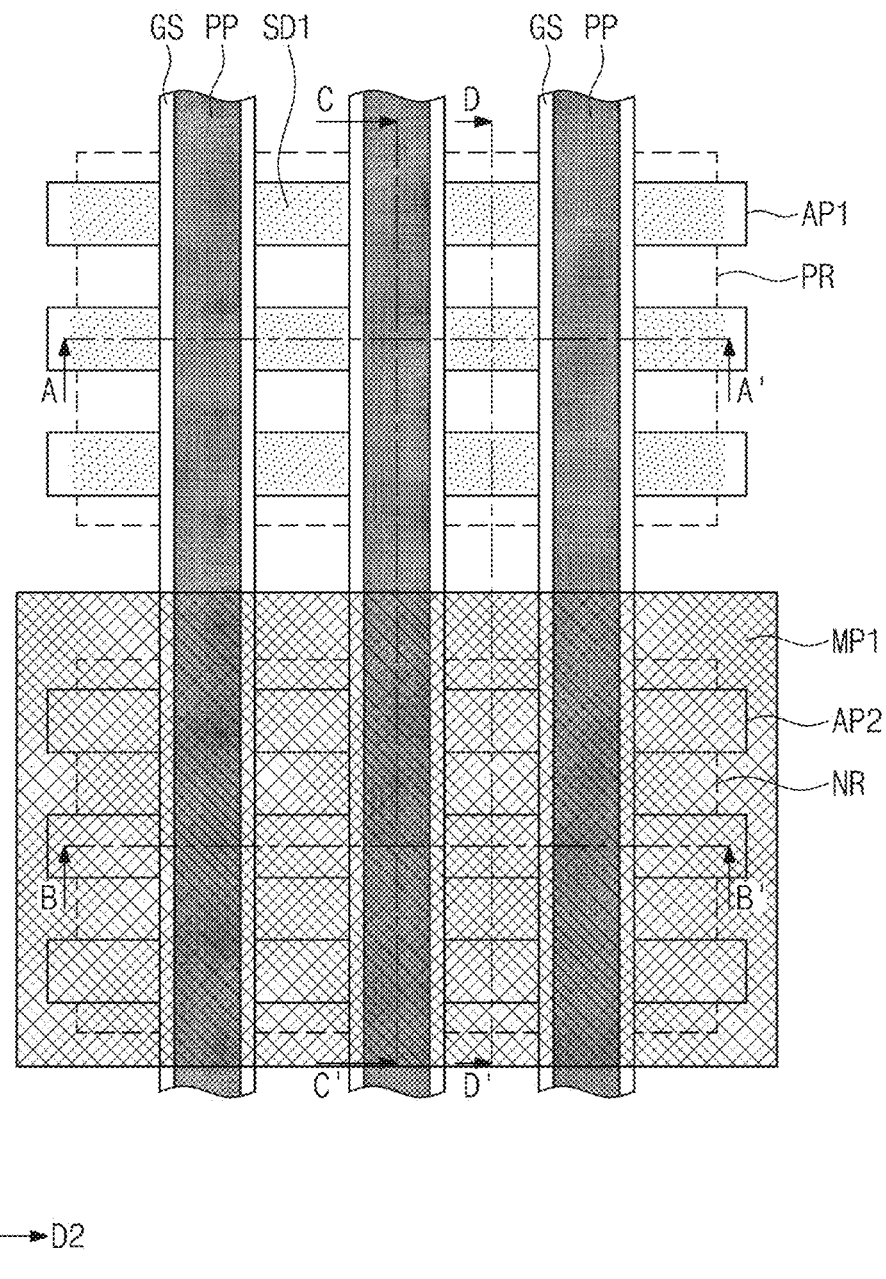
Figure 17A:
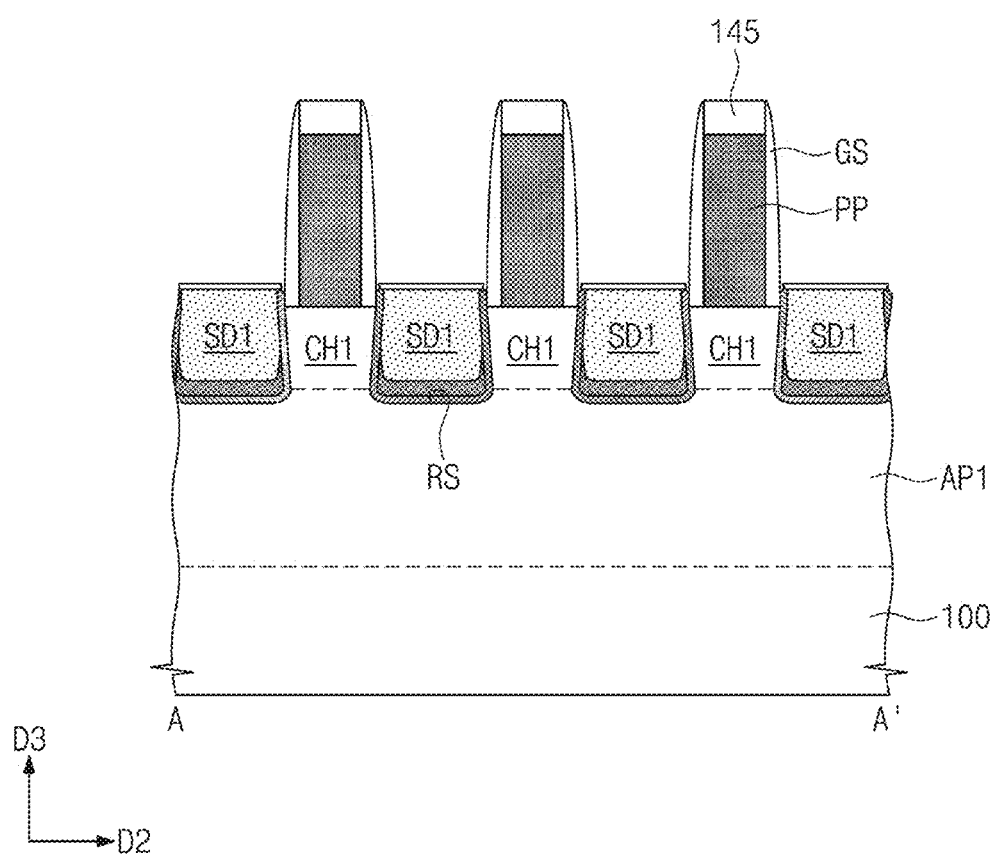
Figure 17B:
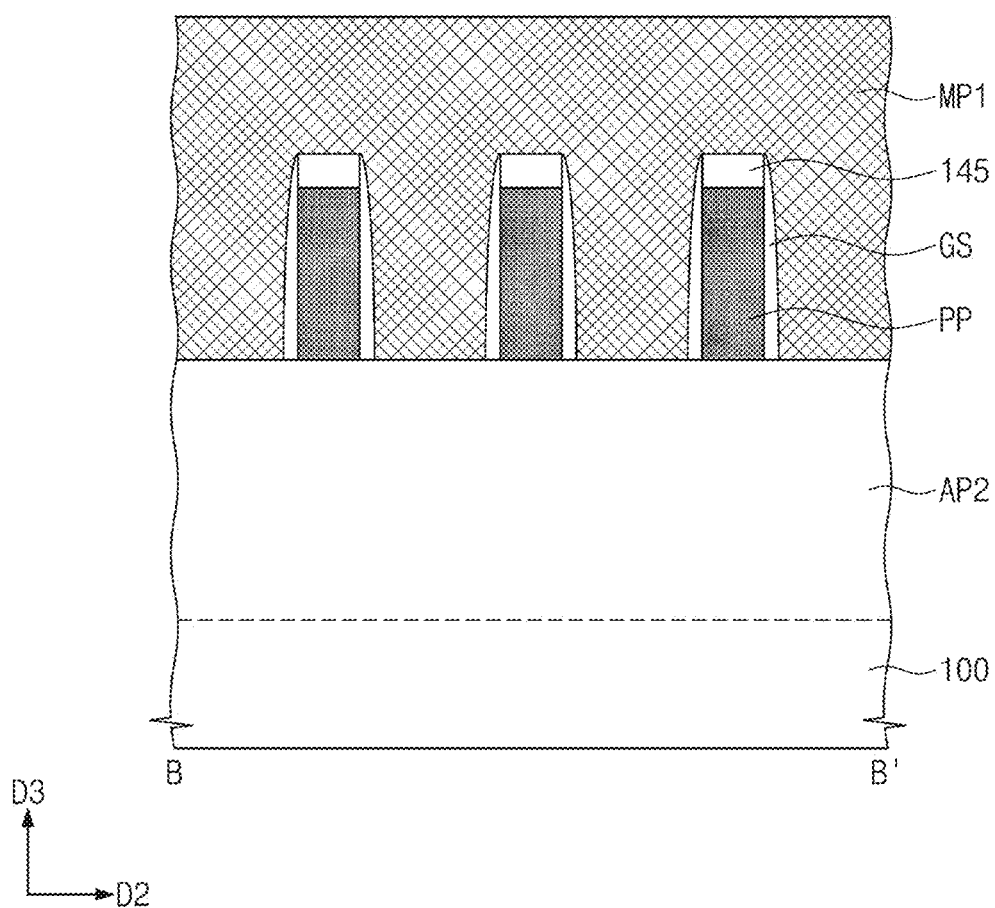
Figure 17C:
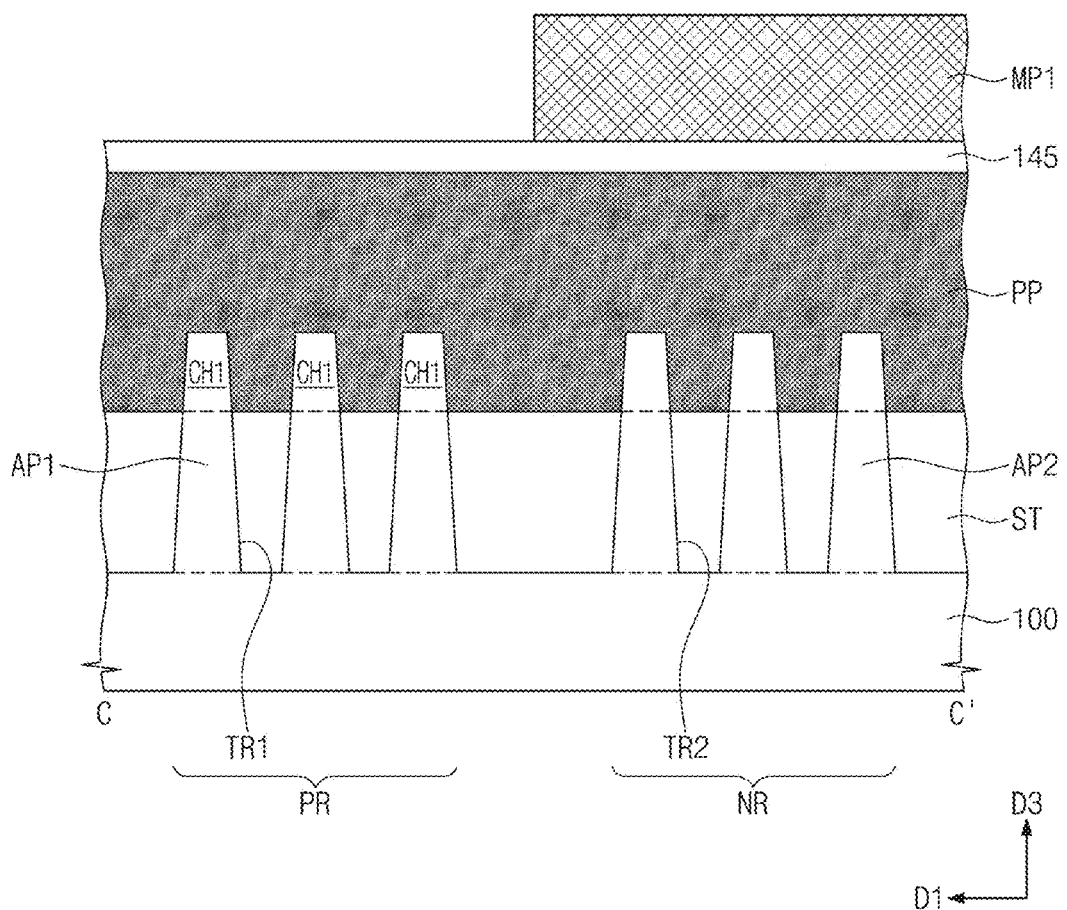
Figure 17D:
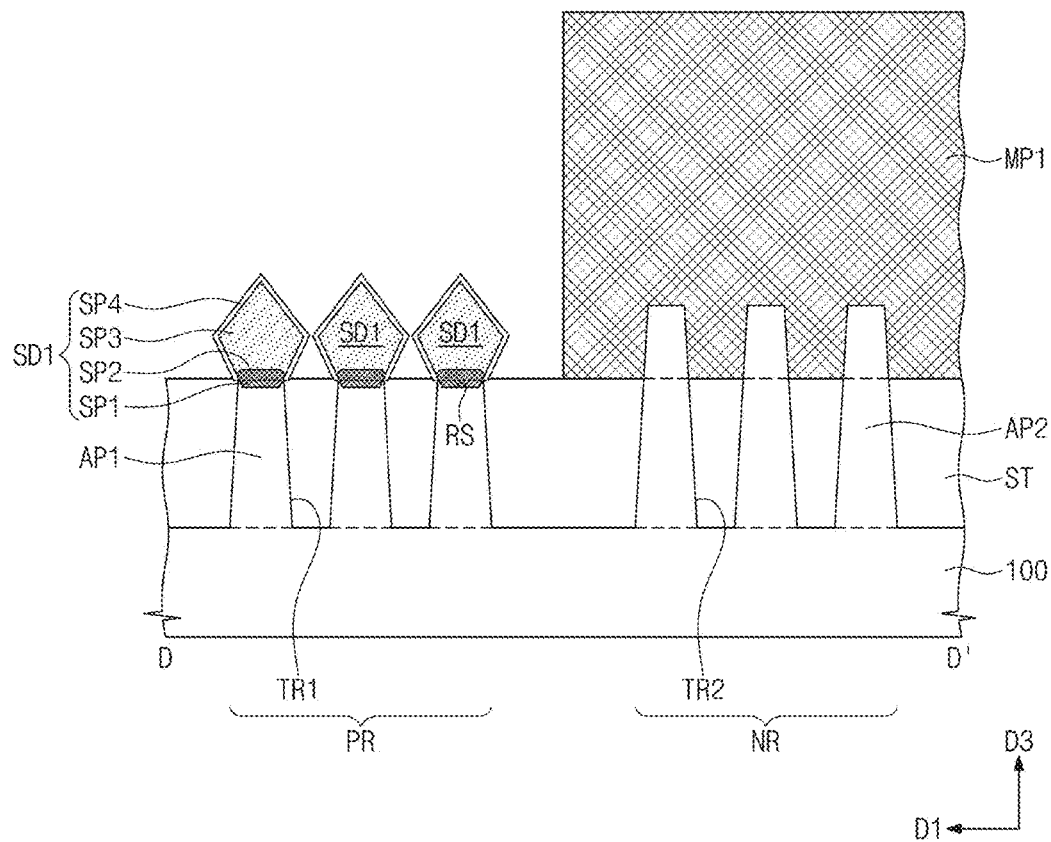
Figure 18:
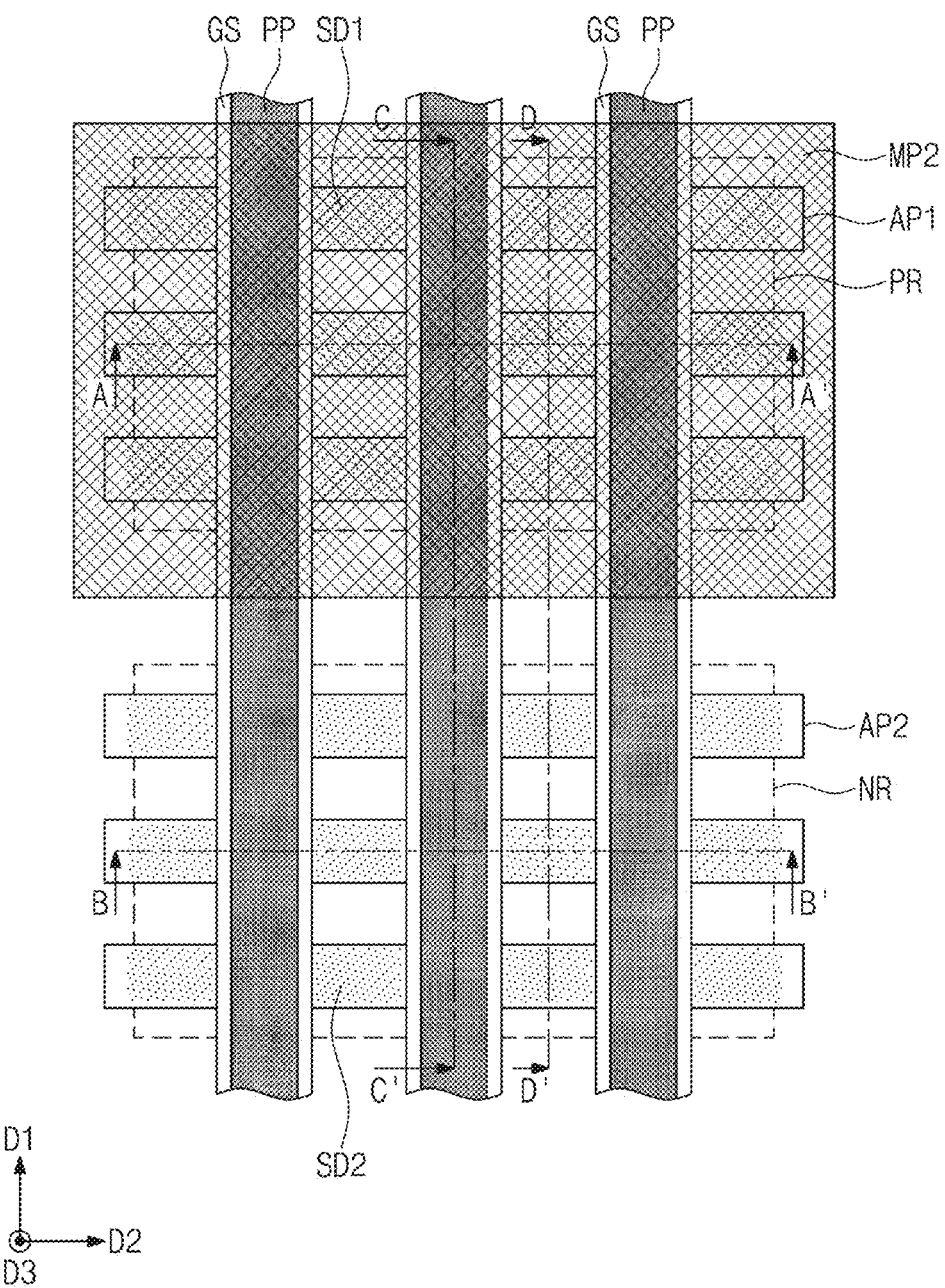
Figure 19A:
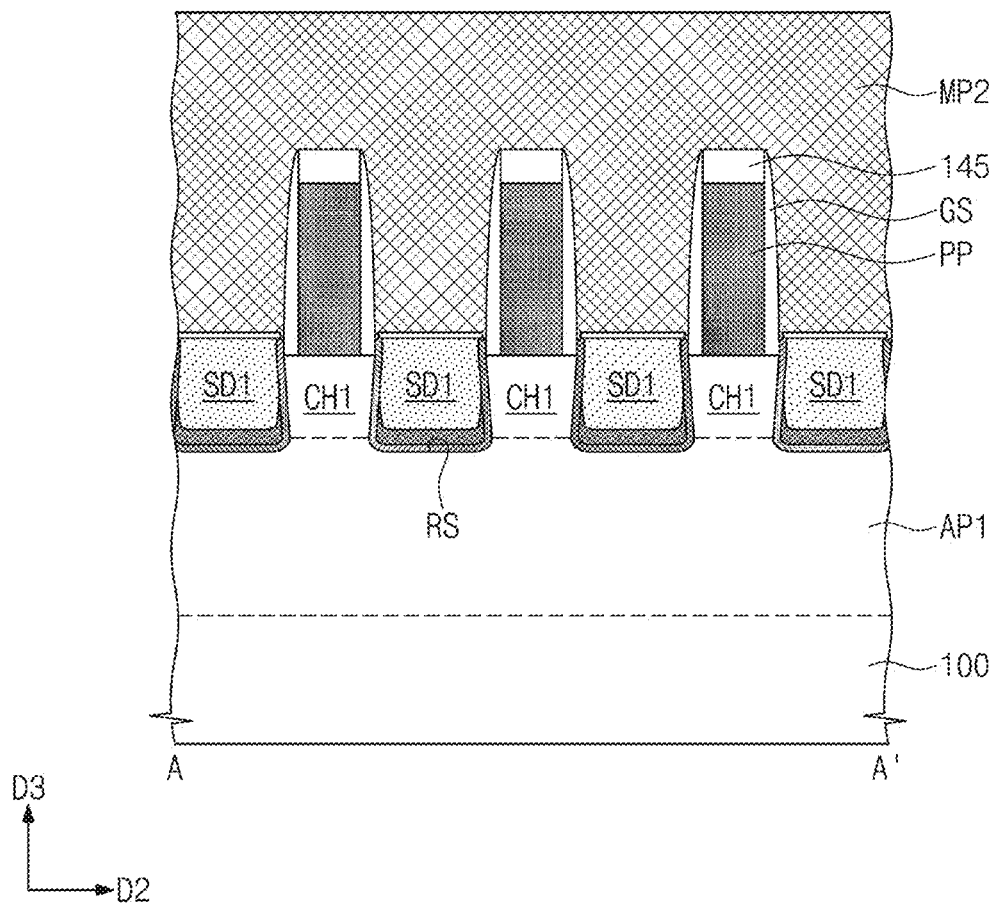
Figure 19B:
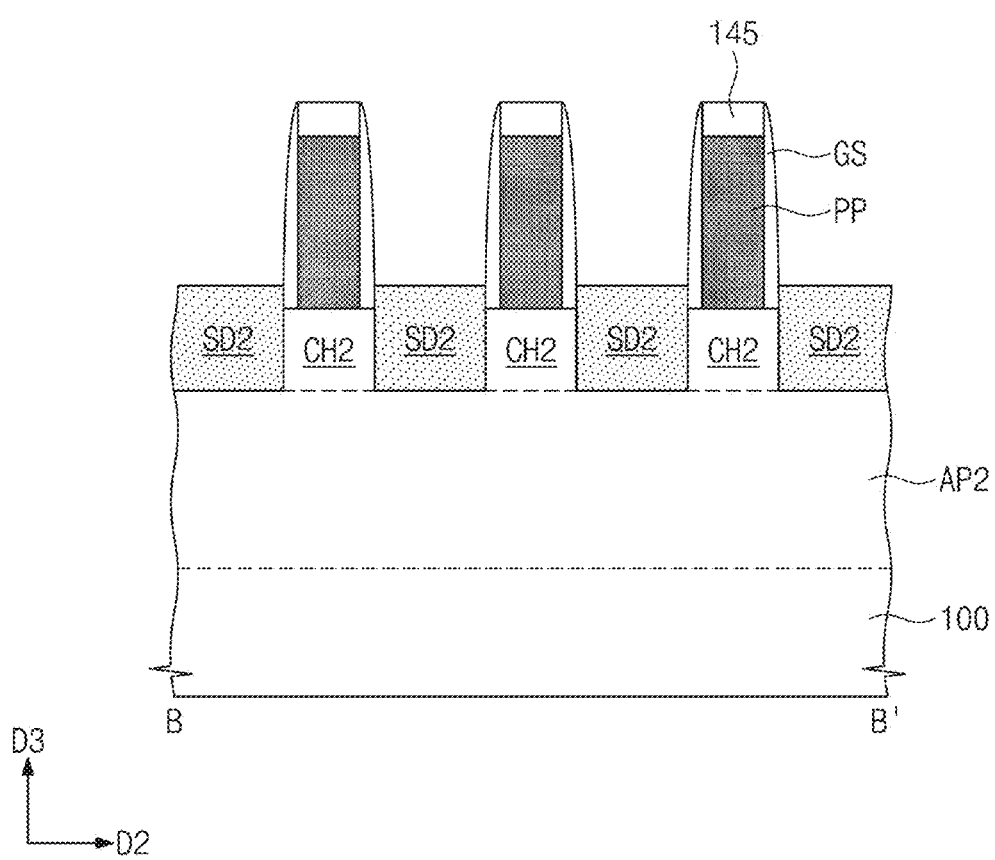
Figure 19C:
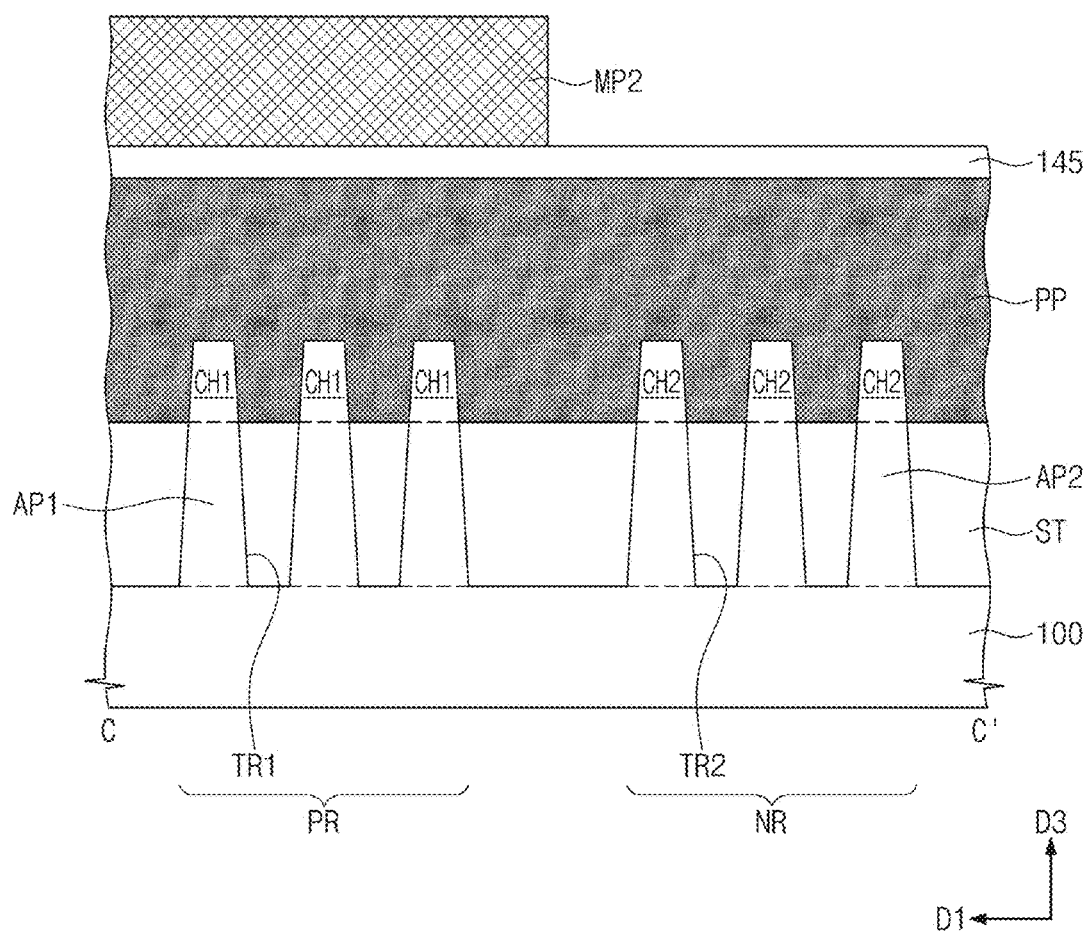
Figure 19D:
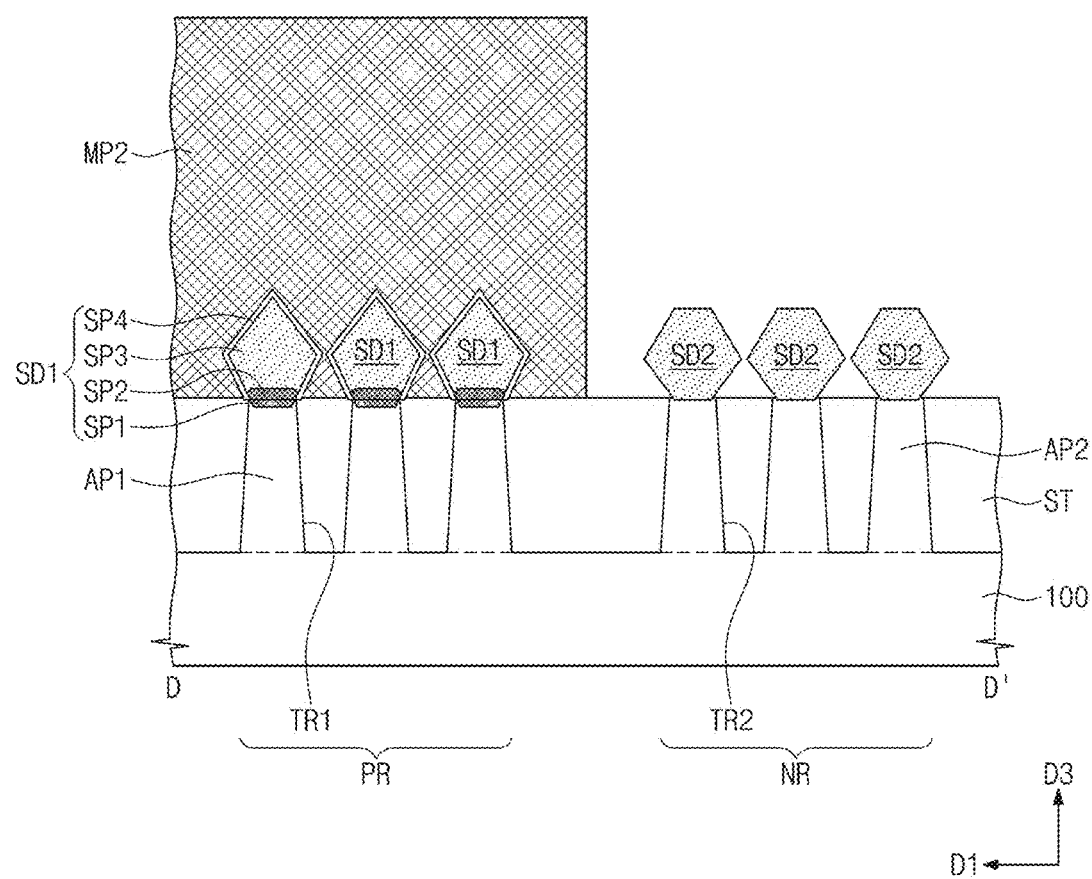
Figure 20:
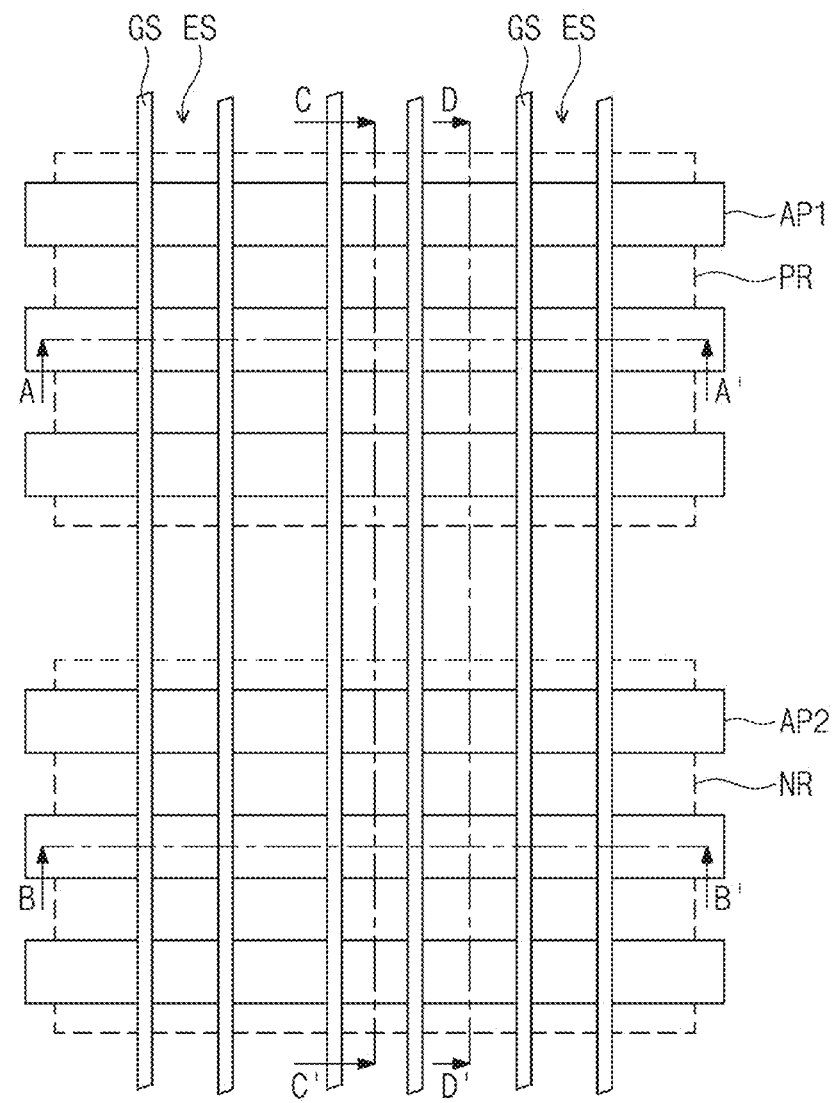
Figure 21A:
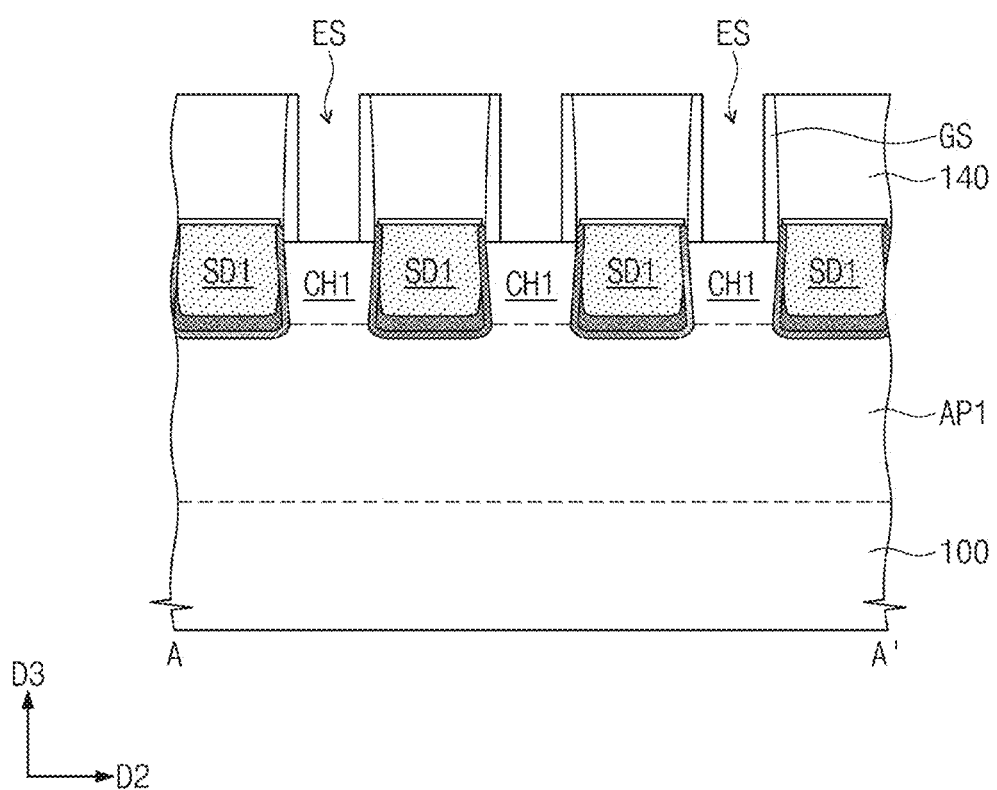
Figure 21B:
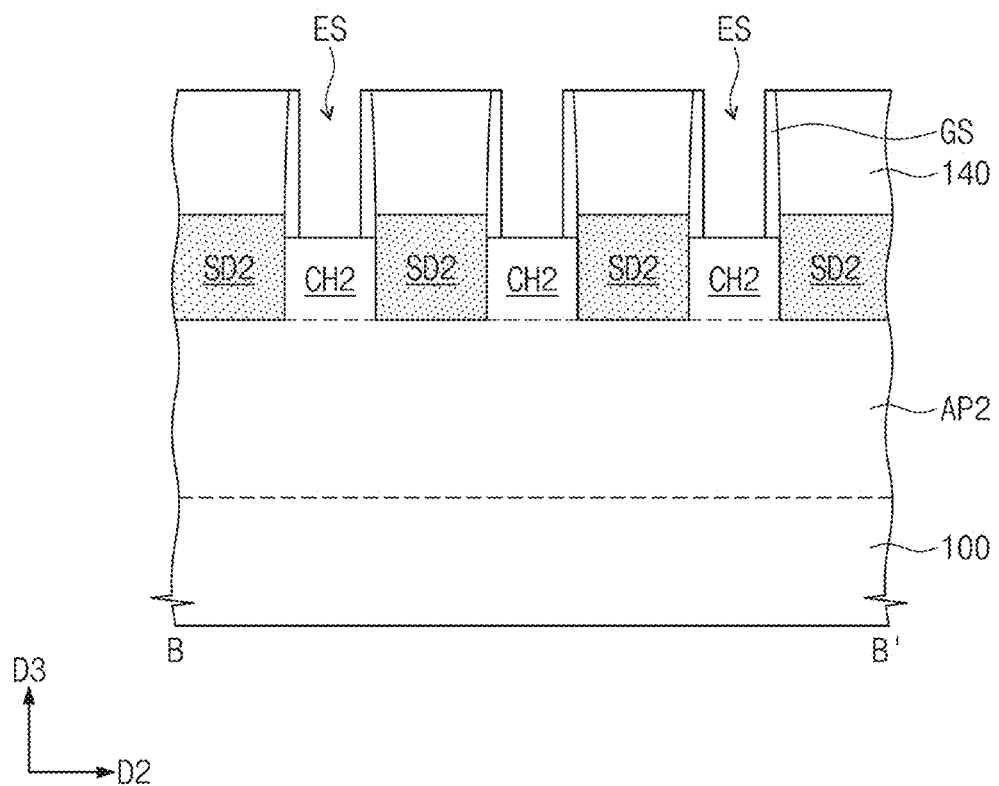
Figure 21C:
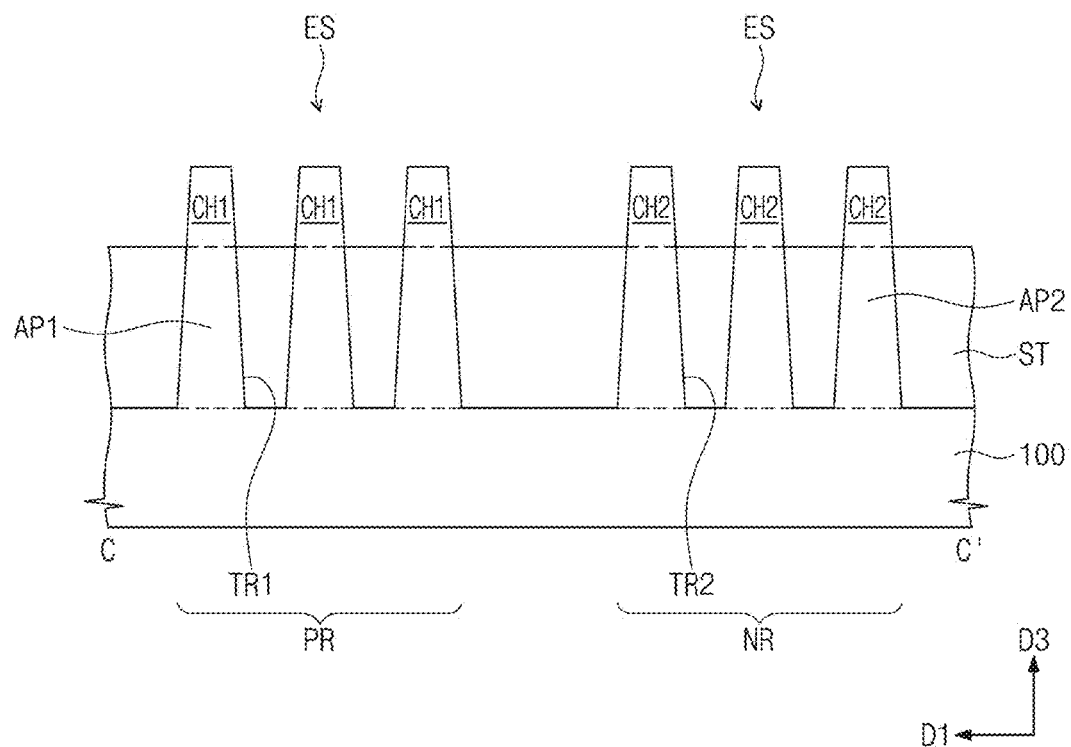
Figure 21D:
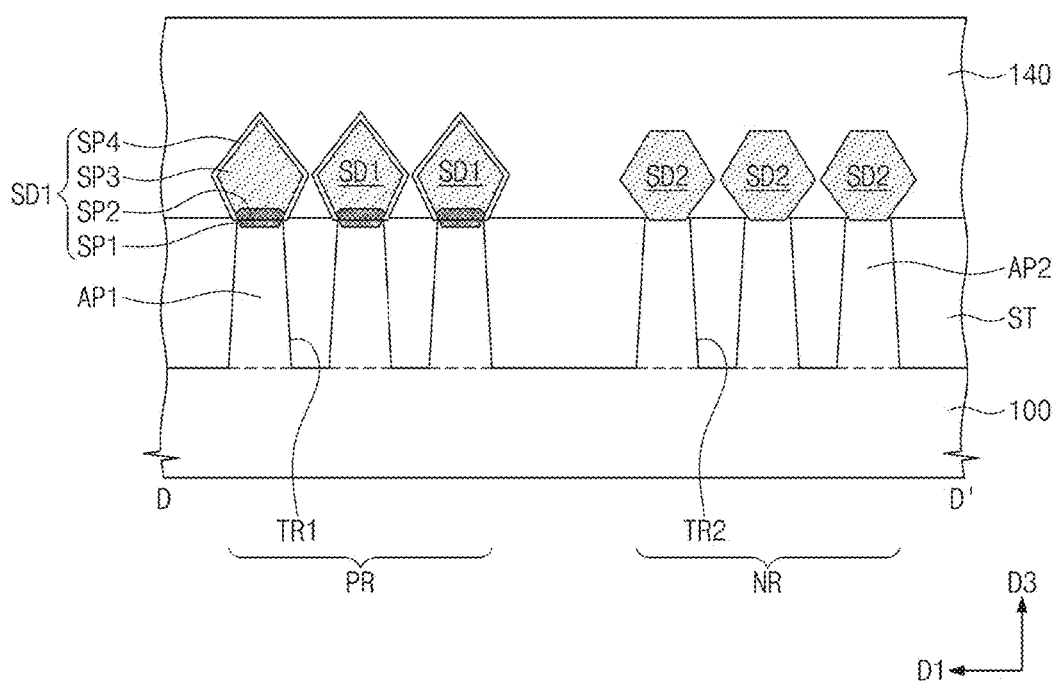
Figure 22:
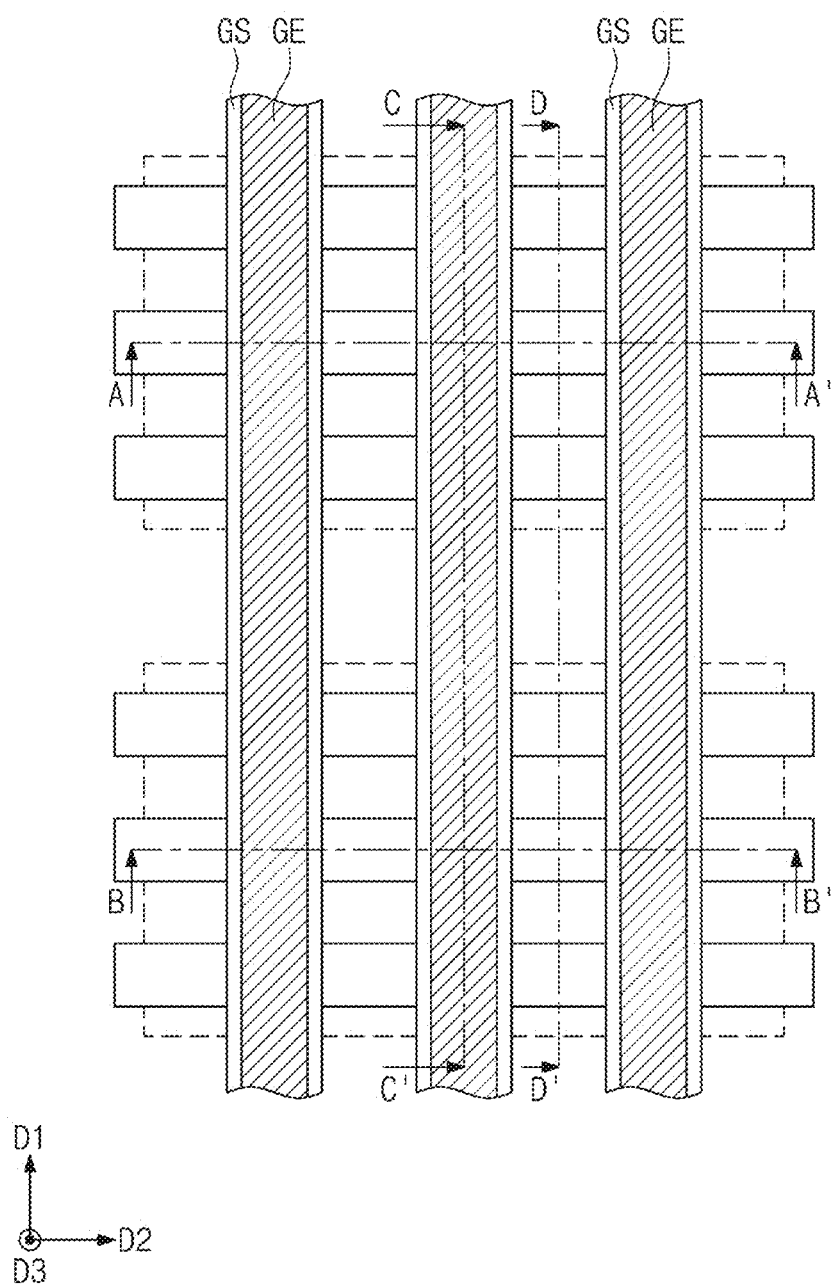
Figure 23A:
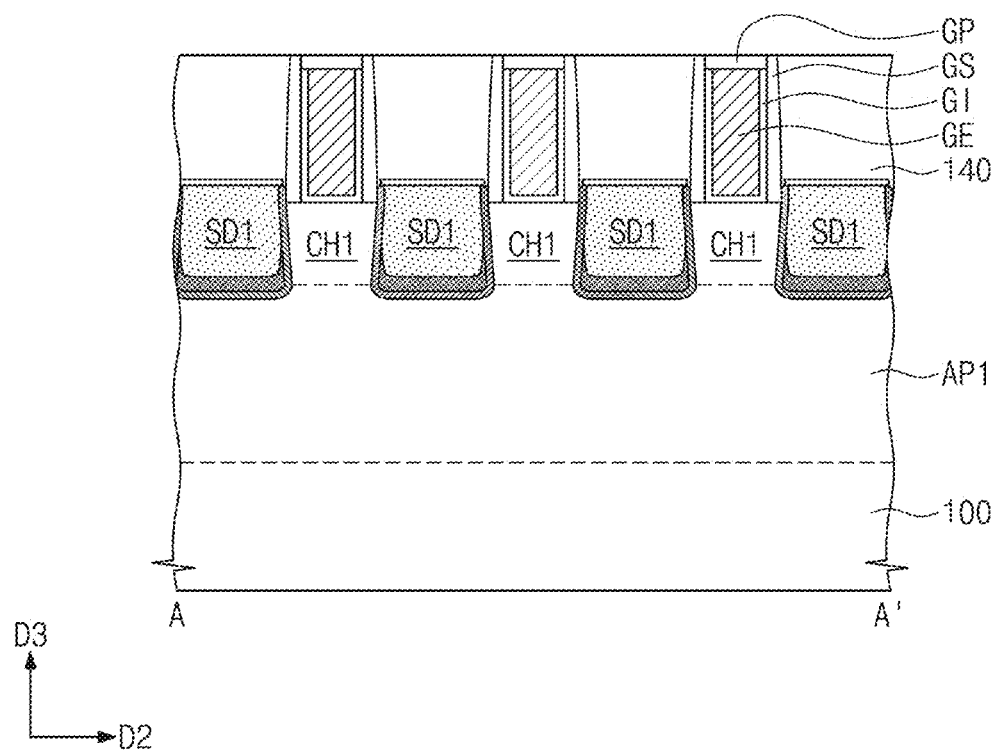
Figure 23B:
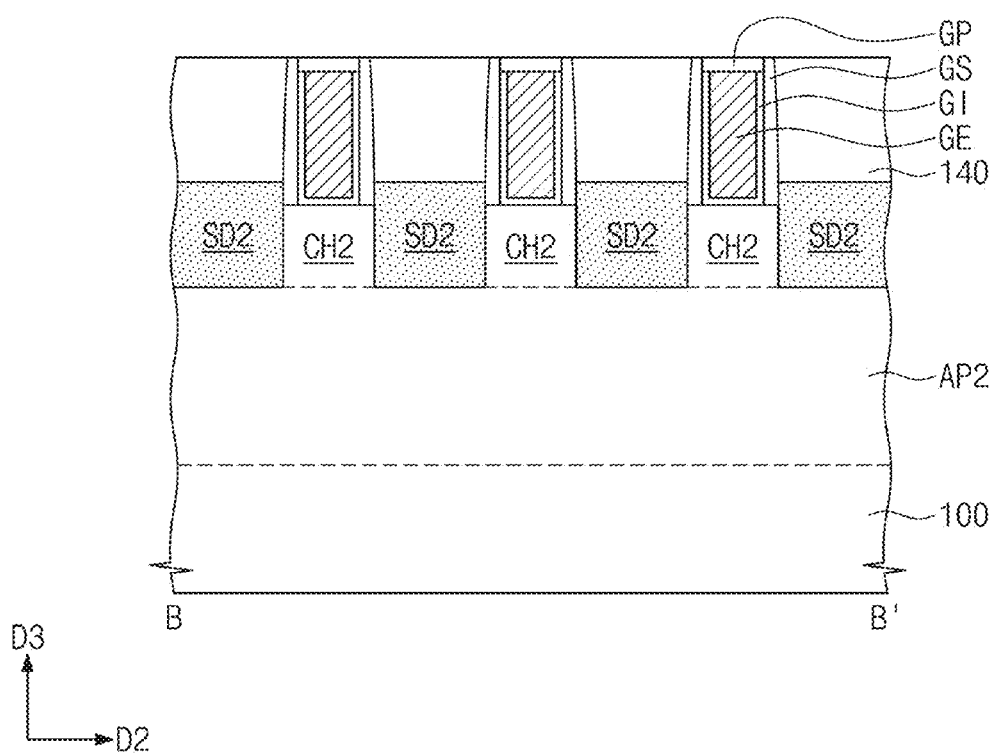
Figure 23C:
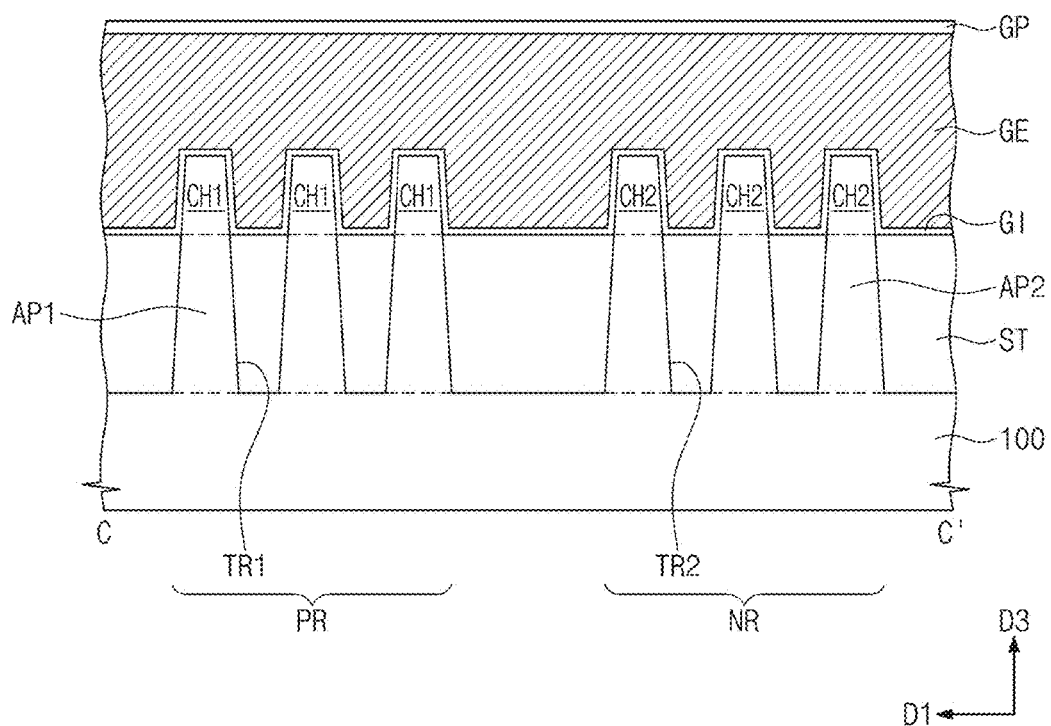
Figure 23D:
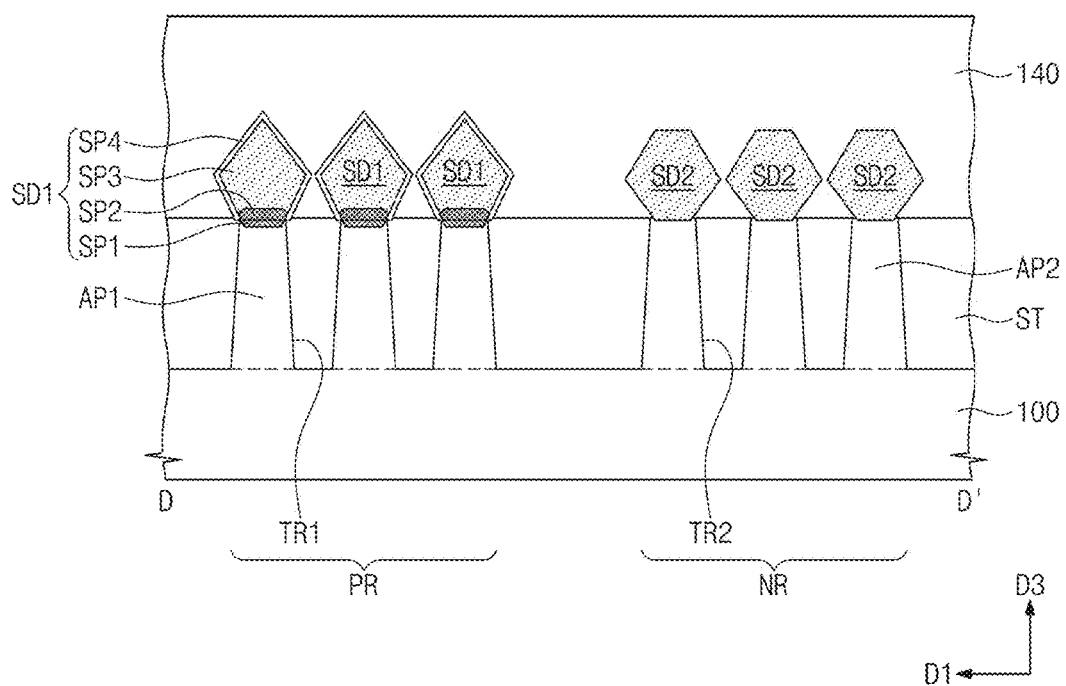

FIG. 12 is a flow chart for explaining a second etching process according to some example embodiments of inventive concepts. FIG. 13 is a graph for explaining RF bias and duty ratio in first and second operations S11 and S12 of a second etching process according to some example embodiments of inventive concepts. FIG. 14 is a cross-sectional view, taken along line A-A' of FIG. 8, for explaining a first operation S 11 of a second etching process according to some example embodiments of inventive concepts. FIG. 15 is a cross-sectional view, taken along line A-A' of FIG. 8, for explaining a second operation S12 of a second etching process according to some example embodiments of inventive concepts.

Referring to FIGS. 10 to 15, a second etching process may be performed on the first active patterns AP1 including the recesses RS formed thereat. The second etching process may include a first operation S11 having a more polymeric condition and a second operation S12 having a less polymeric condition. The first and second operations S11 and S12 may be performed in the same chamber 10. The first and second operations S11 and S12 may be carried out in a cyclic manner repeated at least twice. When the repeat number n of the first and second operations S11 and S12 reaches a preset value N, the second etching process may come to an end (S13).

In this description, the term "a more polymeric condition" may mean a condition that a structure on the substrate 100 is provided on its surface with a polymer (referred to as hereinafter a surface polymer) formed when the structure combines with an etching source in an etching step. The term "a less polymeric condition" may mean a condition that the surface polymer is removed by its desorption. For example, when a CF-based gas is used as the etching source, the surface polymer may be a CF-based polymer. For example, when silicon tetrachloride is used as the etching source, the surface polymer may be silicon oxide. The first operation S11 may be called an absorption step where the surface polymer is relatively easily formed, and the second operation S12 may be called a desorption step where the surface polymer is relatively hardly formed.

In detail, while the substrate 100 experiences the first operation S11 of the second etching process, a surface polymer VP may be formed on the hardmask patterns 145 and the gate spacers GS on the PMOSFET region PR (see FIG. 14). The surface polymer VP may be formed to have a thickness that increases with increasing distance from the substrate 100. Accordingly, substantially no surface polymer VP may be formed in the recesses RS.

While the substrate 100 experiences the second operation S12 of the second etching process, the recesses RS may expand more than before (see FIG. 15). The second operation S12 may be performed by an anisotropic etching process in which the surface polymer VP is used as an etch mask. During the second operation S12, each of the recesses RS may be formed to have an inner sidewall aligned with a sidewall of the surface polymer VP. As such, the expanded recess RS may have a width W7 in the second direction D2 at its lower portion and a width W6 in the second direction D2 at its upper portion. The width W7 may be greater than the width W6. The expanded recess RS may have a floor positioned lower than the top surfaces of the device isolation layers ST. During the second operation S12, the surface polymer VP may be removed by its desorption.

The first second operation S11 may have a process condition different from that of the second operation S12. In detail, a process pressure may be greater in the first operation S11 than in the second operation S12. For example, the first operation S11 may be performed under a chamber pressure of about 6 mTorr to about 25 mTorr, and the second operation S12 may be performed under a chamber pressure of about 3 mTorr to about 9 mTorr.

The first operation S11 may use a first etching source whose ratio of carbon to fluorine (C/F ratio) is relatively greater, and the second operation S12 may use a second etching source whose ratio of carbon to fluorine (C/F ratio) is relatively smaller. The C/F ratio of the first etching source may be greater than about ½, and the C/F ratio of the second etching source may be smaller than about ½. For example, the first etching source may include one or more of $C_4F_6$ (C/F ratio is 1/1.5) and $C_4F_8$ (C/F ratio is ½), and the second etching source may include one or more of $C_2F_6$ (C/F ratio is ⅓) and $CF_4$ (C/F ratio is ¼).

A duty ratio of RF bias may be smaller in the first operation S11 than in the second operation S12. Referring back to FIG. 13, a pulsed RF bias may include a first duration ON and a second duration OFF. The first duration ON may be a period where the RF bias is turned on to apply radio frequency, and the second duration OFF may be period where the RF bias is turned off not to apply radio frequency. The first duration ON may maintain during a first time interval TI1, and the second duration OFF may maintain during a second time interval TI2. The first and second durations ON and OFF may be alternately repeated in a cyclic manner. The duty ratio may be a ratio of the first time interval TI1 to a sum total of the first and second time intervals TI1 and TI2 (or, TI1/(TI1+TI2)).

The first operation S11 may be performed at a duty ratio of about 5% to about 50%. As the first operation S11 has a relatively low duty ratio, active ions contained in an etching gas may have poor directionality toward the substrate 100. The first active patterns AP1 may thus be slightly etched during the first operation S11, and the surface polymer VP may be principally formed instead.

The second operation S12 may be performed at a duty ratio of about 1.1 to about 2 times the duty ratio of the first operation S11. For example, the second operation S12 may be performed at a duty ratio of about 50% to about 100%. In the second operation S12, active ions of an etching gas may have superior directionality toward the substrate 100. The first active patterns AP1 may thus be significantly etched to expand the recesses RS during the second operation S12. Selectively, as not shown in figures, the first operation S11 may have RF bias and/or RF power less than those of the second operation S12.

During the second etching process, the first and second operations S11 and S12 may be repeatedly performed a plurality of times. As the two operations S11 and S12 having different conditions are repeatedly and cyclically performed, the second etching process may have large process windows in comparison with a non-cyclic etching process. In addition, an anisotropic etching process may be efficiently performed on the first active patterns AP1, and therefore each of the recesses RS may expand to have a width that increases with approaching a bottom surface of the substrate 100.

Referring to FIGS. 16 and 17A to 17D, first source/drain regions SD1 may be formed on opposite sides of each of the sacrificial patterns PP. The first source/drain regions SD1 may be formed by a selective epitaxial growth process in which the inner sidewalls of the recesses RS formed at the first active patterns AP1 are used as a seed layer. The formation of the first source/drain regions SD1 may define a first channel region CH1 between a pair of the first source/drain regions SD1. For example, the selective epitaxial growth process may include chemical vapor deposition (CVD) or molecular beam epitaxy (MBE).

During the selective epitaxial growth process by which the first source/drain regions SD1 are formed, the first mask pattern MP1 may protect the NMOSFET region NR. Each of the first source/drain regions SD1 may include a second semiconductor element whose lattice constant is greater than that of a first semiconductor element included in the substrate 100, and may be formed of a plurality of multiple layers.

Each of the first source/drain regions SD1 may include first to fourth semiconductor patterns SP1 to SP4 that are sequentially stacked, as shown in FIG. 3. The first semiconductor pattern SP1 may be formed by a first selective epitaxial growth process that uses the inner sidewalls of the recesses RS as a seed layer. A low concentration may be found in the second semiconductor element contained in the first semiconductor pattern SP1. The first semiconductor pattern SP1 may be lightly doped with an impurity in an in-situ manner. For example, the first semiconductor pattern SP1 may include silicon-germanium (SiGe) in-situ doped with boron. The first semiconductor pattern SP1 may contain a germanium (Ge) content of about 15 at % to about 25 at %.

A higher pressure may maintain in the first selective epitaxial growth process than in second and third epitaxial growth processes which will be discussed below. For example, the first selective epitaxial growth process may be performed under a pressure of about 50 Torr to about 250 Torr. The first semiconductor pattern SP1 may thus be conformally formed on the inner sidewall of the recess RS.

The second semiconductor pattern SP2 may be formed by a second selective epitaxial growth process that uses the first semiconductor pattern SP1 as a seed layer. The second semiconductor pattern SP2 may contain the second semiconductor element whose concentration is greater than that of the second semiconductor element contained in the first semiconductor pattern SP1. The second semiconductor pattern SP2 may be highly doped with an impurity in an in-situ manner. For example, the second semiconductor pattern SP2 may include silicon-germanium (SiGe) in-situ doped with boron. The second semiconductor pattern SP2 may contain a germanium (Ge) content of about 25 at % to about 50 at %.

A lower pressure may maintain in the second selective epitaxial growth process than in the first selective epitaxial growth process. For example, the second selective epitaxial growth process may be performed under a pressure of about 10 Torr to about 50 Torr. Therefore, the second semiconductor pattern SP2 may have a relatively smaller thickness on an inner sidewall of the first semiconductor pattern SP1 and a relatively greater thickness on an inner floor of the first semiconductor pattern SP1. The relatively greater thickness of the second semiconductor pattern SP2 may be larger than a thickness of the first semiconductor pattern SP1.

The third semiconductor pattern SP3 may be formed by a third selective epitaxial growth process that uses the second semiconductor pattern SP2 as a seed layer. The third semiconductor pattern SP3 may contain the second semiconductor element whose concentration is greater than that of the second semiconductor element contained in the second semiconductor pattern SP2. The third semiconductor pattern SP3 may be in-situ doped with an impurity whose concentration is less than that of the impurity doped in the second semiconductor pattern SP2. For example, the third semiconductor pattern SP3 may include silicon-germanium (SiGe) in-situ doped with boron. The third semiconductor pattern SP3 may contain a germanium (Ge) content of about 50 at % to about 75 at %.

A lower pressure may maintain in the third selective epitaxial growth process than in the first selective epitaxial growth process. For example, the third selective epitaxial growth process may be performed under a pressure of about 10 Torr to about 50 Torr.

The fourth semiconductor pattern SP4 may be formed by a fourth selective epitaxial growth process that uses the third semiconductor pattern SP3 as a seed layer. The fourth semiconductor pattern SP4 may include the same first semiconductor element as that of the substrate 100. For example, the fourth semiconductor pattern SP4 may include single crystalline silicon (Si). The aforementioned first to fourth selective epitaxial growth processes may be sequentially performed in the same chamber.

Referring to FIGS. 18 and 19A to 19D, the first mask pattern MP1 may be removed. A second mask pattern MP2 may be formed to cover the PMOSFET region PR. The second mask pattern MP2 may selectively expose the NMOSFET region NR.

An etching process may be performed on the second active patterns AP2, and thus recesses may be formed at upper portions of the second active patterns AP2. The etching of the second active patterns AP2 may be identical to the first etching process discussed above with reference to FIGS. 8 and 9A to 9D.

Second source/drain regions SD2 may be formed to fill the recesses of the second active patterns AP2. The second source/drain regions SD2 may be formed by a selective epitaxial growth process in which inner sidewalls of the recesses formed at the second active patterns AP2 are used as a seed layer. The formation of the second source/drain regions SD2 may define a second channel region CH2 between a pair of the second source/drain regions SD2. During the selective epitaxial growth process by which the second source/drain regions SD2 are formed, the second mask pattern MP2 may protect the PMOSFET region PR.

Referring to FIGS. 20 and 21A to 21D, the second mask pattern MP2 may be removed. A first interlayer dielectric layer 140 may be formed to cover the first and second source/drain regions SD1 and SD2, the hardmask patterns 145, and the gate spacers GS. For example, the first interlayer dielectric layer 140 may include a silicon oxide layer.

The first interlayer dielectric layer 140 may be planarized until exposing top surfaces of the sacrificial patterns PP. An etch-back or chemical mechanical polishing (CMP) process may be performed to planarize the first interlayer dielectric layer 140. During the planarization process, the hardmask patterns 145 may be all removed. As a result, the first interlayer dielectric layer 140 may have a top surface substantially coplanar with the top surfaces of the sacrificial patterns SP and top surfaces of the gate spacers GS. The exposed sacrificial patterns PP may be selectively removed. The removal of the sacrificial patterns PP may form empty spaces ES.

Referring to FIGS. 22 and 23A to 23D, a gate dielectric pattern GI, a gate electrode GE, and a gate capping pattern GP may be formed in each of the empty spaces ES. The gate dielectric pattern GI may be conformally formed so as not to completely fill the empty space ES. The gate dielectric pattern GI may be formed by atomic layer deposition (ALD) or chemical oxidation. For example, the gate dielectric pattern GI may include a high-k dielectric material. The high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may be formed by forming a gate electrode layer to completely fill the empty space ES and planarizing the gate electrode layer. For example, the gate electrode layer may include one or more of conductive metal nitride (e.g., titanium nitride or tantalum nitride) and metal (e.g., titanium, tantalum, tungsten, copper, or aluminum).

Thereafter, the gate electrodes GE may be recessed on their upper portions. The gate capping pattern GP may be formed on each of the gate electrodes GE. The gate capping patterns GP may be formed to completely fill the recesses of the gate electrodes GE. The gate capping patterns GP may include one or more of SiON, SiCN, SiCON, and SiN.

Referring back to FIGS. 1 and 2A to 2D, a second interlayer dielectric layer 150 may be formed on the first interlayer dielectric layer 140 and the gate capping patterns GP. The second interlayer dielectric layer 150 may include a silicon oxide layer or a low-k oxide layer. For example, the low-k oxide layer may include a carbon-doped silicon oxide layer such as SiCOH. A chemical vapor deposition (CVD) process may be performed to form the second interlayer dielectric layer 150.

Contact holes may be formed to penetrate the second and first interlayer dielectric layers 150 and 140 in such a way that the first and second source/drain regions SD1 and SD2 may be exposed through the contact holes. For example, the contact holes may be self-aligned contact holes that are self-aligned by the gate capping patterns GP and the gate spacers GS.

The contact holes may be provided therein with contacts AC in contact with the first and second source/drain regions SD1 and SD2. Each of the contacts AC may include a conductive pillar 165 and a barrier layer 160 surrounding the conductive pillar 165. In detail, the barrier layer 160 may be formed to partially fill the contact holes. After that, a conductive layer may be formed to completely fill the contact holes and then a planarization process may be performed to expose a top surface of the second interlayer dielectric layer 150. The barrier layer 160 may include metal/metal nitride, for example, Ti/TiN, and the conductive pillar 165 may include metal, for example, tungsten.

Figure 24:
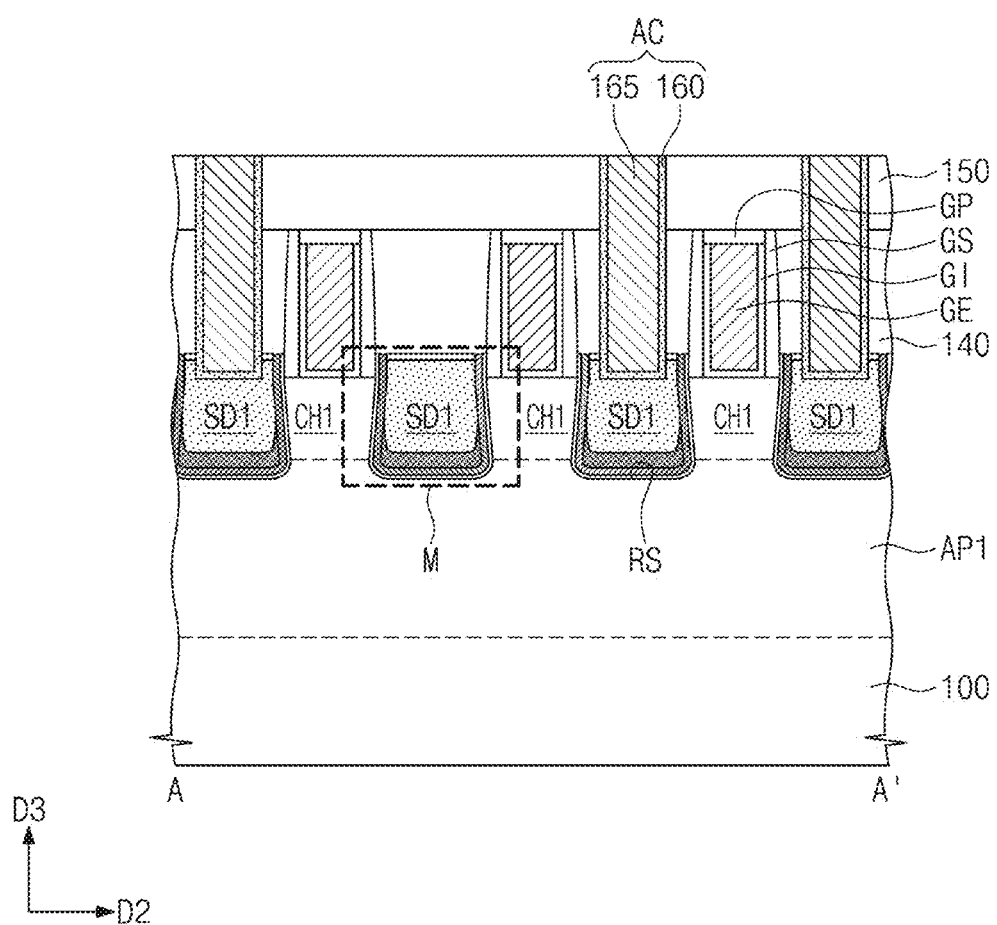
FIG. 24 is a cross-sectional view taken along line A-A' of FIG. 1 for explaining a semiconductor device according to some example embodiments of inventive concepts.
Figure 25:
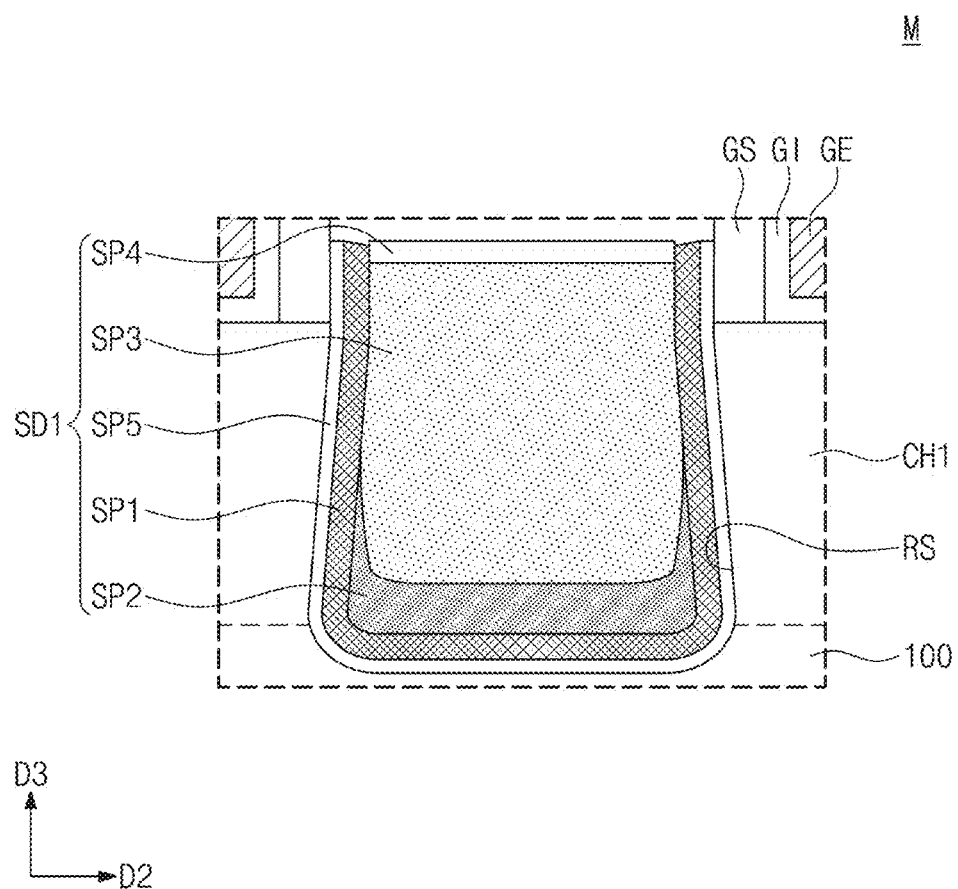
FIG. 25 is an enlarged cross-sectional view of section M shown in FIG. 24.

FIG. 24 is a cross-sectional view taken along line A-A' of FIG. 1 for explaining a semiconductor device according to some example embodiments of inventive concepts. FIG. 25 is an enlarged cross-sectional view of section M shown in FIG. 24. In the embodiment that follows, a detailed description of technical features repetitive to those formerly discussed with reference to FIGS. 1, 2A to 2D, and 3 will be omitted and a difference will be discussed in detail.

Referring to FIGS. 1, 24, and 25, each of the first source/drain regions SD1 may further include a fifth semiconductor pattern SP5 besides the first to fourth semiconductor patterns SP1 to SP4 that are sequentially stacked. The fifth semiconductor pattern SP5 may cover the inner sidewall of the recess RS. The fifth semiconductor pattern SP5 may be interposed between the first semiconductor pattern SP1 and the first active pattern AP1. The fifth semiconductor pattern SP5 may include the same semiconductor element as that of the substrate 100. For example, the fifth semiconductor pattern SP5 may include undoped silicon (Si). The fifth semiconductor pattern SP5 may contain a silicon (Si) content of about 95 at % to about 100 at %.

The recess RS may have a depth greater than that of the recess RS discussed above with reference to FIGS. 1, 2A to 2D, and 3. The first source/drain region SD1 of the present embodiment may have a length in a third direction D3 greater than a length in the third direction D3 of the first source/drain region SD1 discussed above with reference to FIGS. 1, 2A to 2D, and 3. The first source/drain region SD1 may increase in its size with the depth of the recess RS, so that the first channel region CH1 may be provided with a relatively high compressive stress. A relatively high depth of the recess RS may cause occurrence of leakage current. The fifth semiconductor pattern SP5 may limit and/or prevent leakage current from occurring.

In a semiconductor device according to some example embodiments of inventive concepts, one among semiconductor patterns of a source/drain region may have the highest germanium content and occupy the largest volume. The one among semiconductor patterns may have a convex shape protruding toward a channel region. As a result, the source/drain region may provide the channel region with a relatively high compressive stress.

Although some example embodiments of inventive concepts have been discussed with reference to accompanying figures, it will be understood that various changes in form and details may be made therein without departing from the spirit and scope of inventive concepts. It therefore will be understood that the embodiments described above are illustrative and non-limiting.

What is claimed is:

1. A semiconductor device, comprising:
a substrate including a first region and a second region;
a device isolation layer on the substrate,
the device isolation layer defining a first active pattern,
the first active pattern extending in a first direction on the first region,
the first active pattern including a channel region between a pair of recesses formed at an upper portion of the first active pattern; and
a pair of source/drain regions filling the pair of recesses in the first active pattern, each of the pair of source/drain regions including a first semiconductor pattern on an inner sidewall of the recesses and a second semiconductor pattern on the first semiconductor pattern,
a width of the pair of source/drain regions in the first direction at an upper portion of the pair of source/drain regions being less than the width of the pair of source/drain regions in the first direction at a lower portion of the pair of source/drain regions, and
a width of the second semiconductor pattern in the first direction being less at an upper portion of the second semiconductor pattern than the width of the second semiconductor pattern in the first direction at a lower portion of the second semiconductor pattern,
the upper portion of the second semiconductor pattern being positioned higher than a top surface of the channel region.

2. The semiconductor device of claim 1, wherein the width of the lower portion of the second semiconductor pattern is measured at an intermediate level of the second semiconductor pattern between the top surface of the channel region and a bottom surface of the second semiconductor pattern.

3. The semiconductor device of claim 1, wherein the upper portion of the second semiconductor pattern is in contact with an upper inner sidewall of the first semiconductor pattern.

4. The semiconductor device of claim 1, wherein the upper portion of the first active pattern is positioned higher than a top surface of the device isolation layer.

5. The semiconductor device of claim 1, wherein
the substrate contains a first semiconductor element,
the pairs of source/drain regions contain a second semiconductor element whose lattice constant is greater than a lattice constant of the first semiconductor element,
the pairs of source/drain regions further include a third semiconductor pattern between the first semiconductor pattern and the second semiconductor pattern, and
a content of the second semiconductor element in the third semiconductor pattern is greater than a content of the second semiconductor element contained in the first semiconductor pattern and less than a content of the second semiconductor element in the second semiconductor pattern.

6. The semiconductor device of claim 5, wherein a volume of the second semiconductor pattern is greater than a volume of the third semiconductor pattern.

7. The semiconductor device of claim 1, wherein
the substrate contains a first semiconductor element,
the first semiconductor pattern and the second semiconductor patterns contain a second semiconductor element whose lattice constant is greater than a lattice constant of the first semiconductor element,
the pairs of source/drain regions further include a third semiconductor pattern on the second semiconductor pattern, and
the third semiconductor pattern contains the first semiconductor element in a range of about 95 at % to about 100 at %.

8. The semiconductor device of claim 1, wherein
the substrate contains a first semiconductor element,
the pairs of source/drain regions contain a second semiconductor element whose lattice constant is greater than a lattice constant of the first semiconductor element, and
a content of second semiconductor element in the second semiconductor pattern is greater than a content of the second semiconductor element in the first semiconductor pattern.

9. The semiconductor device of claim 1, further comprising:
a gate electrode crossing the channel region of the first active pattern,
wherein the gate electrode surrounds opposite sidewalls of the channel region and the top surface of the channel region.

10. The semiconductor device of claim 1, wherein
the device isolation layer defines a second active pattern extending in the first direction on the second region,
the first region is a PMOSFET region, and
the second region is an NMOSFET region.

11. A semiconductor device, comprising:
a substrate including a first region and a second region, the substrate containing a first semiconductor element; and
a first active pattern on the first region of the substrate, the first active pattern extending in a first direction,
the first active pattern including a channel region and a pair of source/drain regions spaced apart from each other in the first direction across the channel region,
the pair of source/drain regions containing a second semiconductor element whose lattice constant is greater than a lattice constant of the first semiconductor element,
the pair of source/drain regions including a plurality of semiconductor patterns sequentially stacked,
the plurality of semiconductor patterns including a first semiconductor pattern,
a content of the second semiconductor element in the first semiconductor pattern being greater than a content of the second semiconductor element in any other one of the plurality of semiconductor patterns, and
a width of the first semiconductor pattern in the first direction at an upper portion of the first semiconductor pattern being less than the width of the first semiconductor pattern in the first direction at a lower portion of the first semiconductor pattern,
the upper portion of the first semiconductor pattern being positioned higher than a top surface of the channel region.

12. The semiconductor device of claim 11, wherein the width of the lower portion of the first semiconductor pattern is measured at an intermediate level of the first semiconductor pattern between the top surface of the channel region and a bottom surface of the first semiconductor pattern.

13. The semiconductor device of claim 11, wherein
the plurality of semiconductor patterns include a second semiconductor pattern,
the second semiconductor pattern is in contact with the channel region, and
the upper portion of the first semiconductor pattern is in contact with an upper inner sidewall of the second semiconductor pattern.

14. The semiconductor device of claim 13, wherein
the plurality of semiconductor patterns further include a third semiconductor pattern between the first semiconductor pattern and the second semiconductor pattern,
a content of the second semiconductor element in the third semiconductor pattern is greater than the content of the second semiconductor element in the second semiconductor pattern and less than the content of the second semiconductor element of the second semiconductor element in the first semiconductor pattern.

15. The semiconductor device of claim 11, wherein the first region is a PMOSFET region, and the second region is an NMOSFET region.

16. A semiconductor device, comprising:
a substrate;
a plurality of active patterns spaced apart from each other on the substrate,
the plurality of active patterns including a first active pattern extending in a first direction,
the first active pattern including first channel regions and recessed regions alternately arranged in the first direction,
the first channel regions protruding above the recessed regions,
a gate electrode crossing over the first channel regions of the first active pattern;
a gate dielectric pattern between the gate electrode and the first channel regions of the first active pattern; and
source/drain regions in the recessed regions of the first active pattern,
wherein each of the source/drain regions includes a plurality of semiconductor patterns,
wherein the plurality of semiconductor patterns include a first semiconductor pattern on an inner sidewall of the recessed regions in the first active pattern and a second semiconductor pattern on the first semiconductor pattern in the recessed regions, and
wherein the recessed regions of the first active pattern having a maximum width at a level between a bottom surface of the second semiconductor pattern and a bottom surface of the first semiconductor pattern.

17. The semiconductor device of claim 16, further comprising a device isolation layer on the substrate,
wherein the plurality of active patterns protrude through the device isolation layer.

18. The semiconductor device of claim 16, wherein
the plurality of active patterns include a second active pattern spaced apart from the first active pattern in a second direction crossing the first direction,
the second active pattern includes second channel regions and recesses alternately arranged in the first direction, and
a depth of the recesses in the second active pattern is less than a depth of the recessed regions in the first active pattern.

19. The semiconductor device of claim 16, wherein
a width of the second semiconductor pattern in the first direction at an upper portion of the second semiconductor pattern is less than the width of the second semiconductor pattern in the first direction at a lower portion of the second semiconductor pattern, and
the upper portion of the second semiconductor pattern is positioned higher than a top surface of the first channel regions.

20. The semiconductor device of claim 16, wherein
each of the plurality of semiconductor patterns include a semiconductor element whose lattice constant is greater than a lattice constant of a semiconductor material in the substrate, and
a concentration of the semiconductor element in the second semiconductor pattern is greater than a concentration of the semiconductor element in the first semiconductor pattern.

* * * * *